US009991162B2

(12) United States Patent
Matsuura

(10) Patent No.: US 9,991,162 B2
(45) Date of Patent: Jun. 5, 2018

(54) SEMICONDUCTOR DEVICE AND MANUFACTURING METHOD THEREOF

(71) Applicant: Renesas Electronics Corporation, Koutou-ku, Tokyo (JP)

(72) Inventor: Masazumi Matsuura, Kanagawa (JP)

(73) Assignee: Renesas Electronics Corporation, Tokyo (JP)

( * ) Notice: Subject to any disclaimer, the term of this patent is extended or adjusted under 35 U.S.C. 154(b) by 0 days. days.

(21) Appl. No.: 15/632,821

(22) Filed: Jun. 26, 2017

(65) Prior Publication Data
US 2017/0294352 A1 Oct. 12, 2017

Related U.S. Application Data

(62) Division of application No. 14/084,155, filed on Nov. 19, 2013, now Pat. No. 9,721,873.

(30) Foreign Application Priority Data

Nov. 22, 2012 (JP) .................................. 2012-256874

(51) Int. Cl.
H01L 23/48 (2006.01)
H01L 21/28 (2006.01)
H01L 21/768 (2006.01)
H01L 21/8234 (2006.01)

(52) U.S. Cl.
CPC .. H01L 21/76898 (2013.01); H01L 21/76802 (2013.01); H01L 21/76831 (2013.01); H01L 21/76877 (2013.01)

(58) Field of Classification Search
CPC ....... H01L 21/44; H01L 21/469; H01L 23/48; H01L 23/52
USPC ........ 438/667, 197; 257/621, 760, 737, 774, 257/E21.258
See application file for complete search history.

(56) References Cited

U.S. PATENT DOCUMENTS

| 7,061,118 | B2 | 6/2006 | Masuda |
| 8,378,462 | B2 | 2/2013 | Matsumoto |
| 8,399,354 | B2 | 3/2013 | Chen |
| 2001/0009805 | A1 | 7/2001 | Ha et al. |
| 2009/0014888 | A1 | 1/2009 | Lee et al. |
| 2009/0140431 | A1 | 6/2009 | Feustel et al. |
| 2009/0315154 | A1 | 12/2009 | Kirby et al. |

(Continued)

FOREIGN PATENT DOCUMENTS

| JP | 11-195706 A | 7/1999 |
| JP | 2004-356617 A | 12/2004 |

(Continued)

Primary Examiner — Kimberly Rizkallah
Assistant Examiner — Brian Turner
(74) Attorney, Agent, or Firm — Foley & Lardner LLP

(57) ABSTRACT

A semiconductor device with a through via penetrating a semiconductor substrate, in which shorting between a wiring and a semiconductor element is prevented to improve the reliability of the semiconductor device. A liner insulating film as a low-k film, which has a function to insulate the semiconductor substrate and a through-silicon via from each other and is thick enough to reduce capacitance between the semiconductor substrate and the through-silicon via, is used as an interlayer insulating film for a first wiring layer over a contact layer. This prevents a decrease in the thickness of an interlayer insulating film in the contact layer.

5 Claims, 22 Drawing Sheets

(56) References Cited

U.S. PATENT DOCUMENTS

| | | |
|---|---|---|
| 2010/0297844 A1 | 11/2010 | Yelehanka et al. |
| 2012/0032323 A1 | 2/2012 | Matsumoto et al. |
| 2012/0319291 A1 | 12/2012 | Chiou et al. |
| 2014/0061924 A1 | 3/2014 | Chen et al. |
| 2014/0264630 A1* | 9/2014 | Huang ............... H01L 23/481 257/401 |
| 2014/0287579 A1* | 9/2014 | Vijayen ............ H01L 21/76801 438/637 |
| 2014/0363971 A1* | 12/2014 | Matsumoto ............ C23C 16/40 438/653 |

FOREIGN PATENT DOCUMENTS

| | | |
|---|---|---|
| JP | 2005-210048 | 8/2005 |
| JP | 2010-166052 A | 7/2010 |
| JP | 2010-205990 A | 9/2010 |
| JP | 2013-074275 A | 4/2013 |

\* cited by examiner

SEMICONDUCTOR DEVICE AND MANUFACTURING METHOD THEREOF

CROSS-REFERENCE TO RELATED APPLICATIONS

This application is a continuation of U.S. application Ser. No. 14/084,155, filed on Nov. 19, 2013, which claims benefit of priority from the prior Japanese Application No. 2012-256874, filed on Nov. 22, 2012; the entire contents of all of which are incorporated herein by reference.

BACKGROUND

The present invention relates to semiconductor devices and manufacturing methods thereof and more particularly to technology useful for semiconductor devices which have vias penetrating a semiconductor substrate.

A Through-Silicon Via (TSV) is known as a means to electrically couple different types of devices in a three-dimensional multifunctional device manufactured by vertically stacking different types of devices such as memory devices, logic devices or MEMS (Micro Electro Mechanical Systems) chips.

A through-silicon via is associated with a technique of making a via electrode which penetrates a semiconductor substrate. The methods of making such a via include a via middle method in which a through-silicon via is made in the course of formation of an LSI (Large Scale Integration).

Japanese Unexamined Patent Publication No. 2010-166052 describes that a liner insulating film covering the sidewall of a through-silicon via penetrating a semiconductor substrate is left as part of an interlayer film. It is described there that the liner insulating film is a TEOS (Tetra Ethyl Ortho Silicate) film.

Japanese Unexamined Patent Publication No. 2010-205990 describes that a via hole is made by etching the back surface of a semiconductor substrate and copper film is buried in the via hole to form a through via.

Japanese Unexamined Patent Publication No. 2005-210048 describes that a plug is formed in a hole penetrating a semiconductor substrate, through an insulating film as a TEOS film with a thickness of about 1 μm and the insulating film is left on the main surface of the semiconductor substrate.

RELATED ART DOCUMENTS

Patent Documents

[Patent Document 1]
  Japanese Unexamined Patent Publication No. 2010-166052
[Patent Document 2]
  Japanese Unexamined Patent Publication No. 2010-205990
[Patent Document 3]
  Japanese Unexamined Patent Publication No. 2010-210048

SUMMARY

The process of forming a through-silicon via may be as follows: after making a deep hole in an interlayer insulating film covering a transistor and a semiconductor substrate, a liner insulating film covering the inside surface of the hole and the upper surface of the interlayer insulating film, and a metal film filling the hole are formed sequentially and then the liner insulating film and metal film overlying the interlayer insulating film are removed. In the process, after that, a plurality of wiring layers are stacked over the interlayer insulating film, then the back surface of the semiconductor substrate is polished to expose the bottom of the metal film to complete a through-silicon via made of the metal film.

Here, if the thickness of the liner insulating film is increased in order to reduce capacitance between the through-silicon via and semiconductor substrate, when removing the liner insulating film over the interlayer insulating film by polishing, it might be excessively polished to the extent that the interlayer insulating film becomes thin, resulting in shorting between a wiring formed over the interlayer insulating film and the element. An object of the present invention is to provide a semiconductor device with a through via penetrating a semiconductor substrate, in which shorting between a wiring and a semiconductor element is prevented to improve the reliability of the semiconductor device.

The above and further objects and novel features of the invention will more fully appear from the following detailed description in this specification and the accompanying drawings.

A major aspect of the present invention which will be disclosed herein is briefly outlined below.

According to an aspect of the present invention, there is provided a semiconductor device which uses a liner insulating film, which has a function to insulate a semiconductor substrate and a through-silicon via from each other and is thick enough to reduce capacitance between the semiconductor substrate and the through-silicon via, as an interlayer insulating film for a first wiring layer over a contact layer.

According to the above aspect of the present invention, the reliability of the semiconductor device is improved.

DETAILED DESCRIPTION

Figure 1:
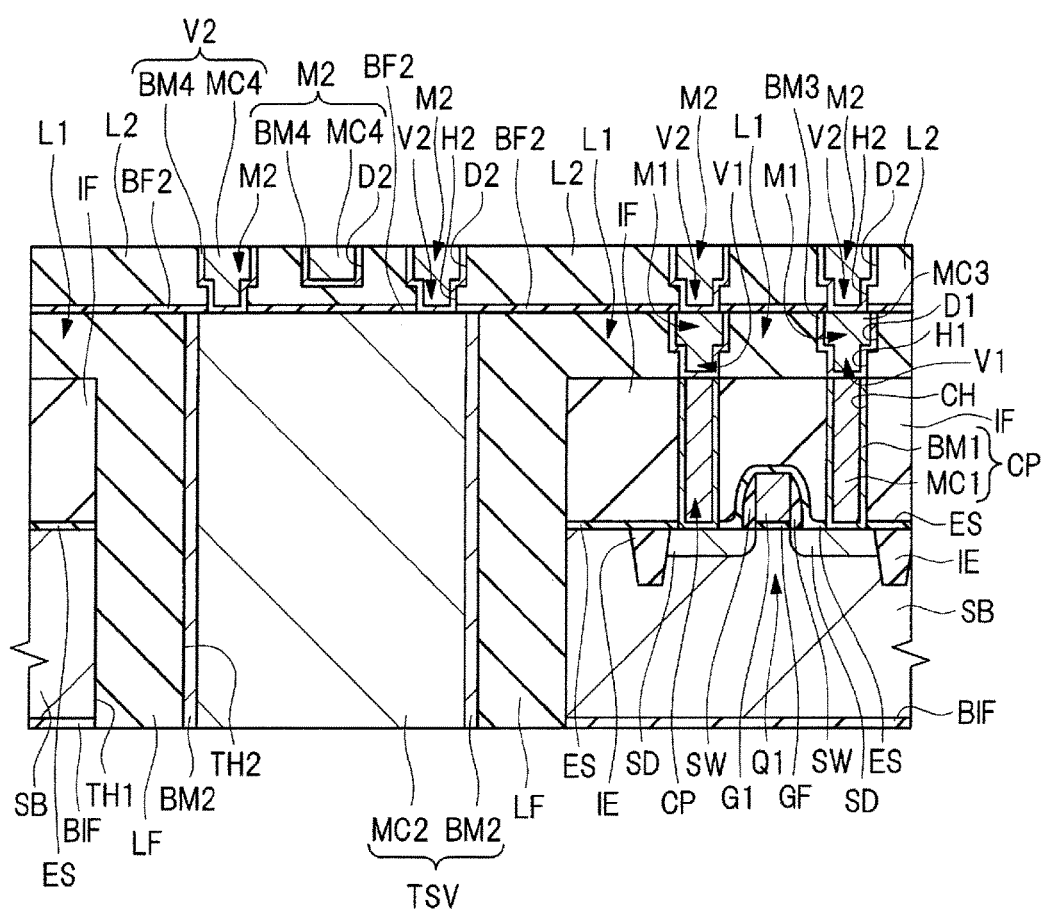
FIG. 1 is a sectional view showing a semiconductor device according to a first embodiment of the present invention.

Next, the preferred embodiments of the present invention will be described in detail referring to the accompanying drawings. In all the drawings that illustrate the preferred embodiments, elements with like functions are designated by like reference numerals and repeated descriptions thereof are omitted. Basically, regarding the preferred embodiments mentioned below, descriptions of the same or similar elements are not repeated except when necessary.

A through-silicon via is associated with a technique of making a via electrode penetrating a semiconductor substrate. The methods of making such a via are classified into the following three types according to when to make the via: the via first method in which a through-silicon via is made before the formation of an LSI, the via middle method in which a through-silicon via is made in the course of formation of an LSI, and the via last method in which a through-silicon via is made after the formation of an LSI. The via middle method can be relatively easily introduced into the LSI process, so the preferred embodiments will be described below with focus on how to make a through-silicon via by the via middle method. Also, an explanation will be given of a wiring structure which is suitable for reduction of capacitance between the through-silicon via and the semiconductor substrate for the purpose of increasing the speed of a signal transmitted through the through-silicon via.

Here, "height" means the distance from the main surface of the semiconductor substrate to the upper surface of an object in a direction perpendicular to the main surface of the semiconductor substrate. Also, "width" here means the length from one end of an object to the other end of the object in a direction along the main surface of the semiconductor substrate.

First Embodiment

FIG. 1 is a sectional view of a semiconductor device according to the first embodiment. As shown in FIG. 1, the semiconductor device according to this embodiment includes a MOSFET (Metal Oxide Semiconductor Field Effect Transistor) Q1 as a semiconductor element formed over the upper surface of a semiconductor substrate SB. In this example, the element formed on the main surface of the semiconductor substrate SB is the MOSFET Q1, but the element is not necessarily a MOSFET. For instance, the semiconductor element formed over the semiconductor substrate SB may be a bipolar transistor, diode, nonvolatile memory, capacitive element or resistive element.

The MOSFET Q1 includes a gate electrode G1 formed over the main surface of the semiconductor substrate SB of monocrystalline silicon through a gate insulating film GF and source/drain regions SD as semiconductor regions formed over the main surface of the semiconductor substrate SB on the sides of the gate electrode G1. The gate insulating film GF is, for example, a silicon oxide film and the gate electrode G1 is, for example, made of polysilicon film. The height from the main surface of the semiconductor substrate SB to the upper surface of the gate electrode G1 is, for example, 0.1 to 0.15 μm.

A ditch is made in the main surface of the semiconductor substrate SB and an element isolation region IE is formed inside the ditch, as an insulating layer which insulates a semiconductor element electrically and defines an active region. The element isolation region IE is, for example, a silicon oxide film and has an STI (Shallow Trench Isolation) structure. For example, the element isolation region IE may have a LOCOS (Local Oxidization of Silicon) structure.

The MOSFET Q1 lies over the area of the main surface of the semiconductor substrate SB which is exposed from the element isolation region IE, namely over the active region, and a p-type well (not shown) doped with p-type impurities (for example, B (boron)) is formed in the active region of the main surface of the semiconductor substrate SB. The source region and drain region each include an extension region as a semiconductor region formed by implanting n-type impurities (for example, As or arsenic) into the main surface of the semiconductor substrate SB, and a diffusion layer doped with n-type impurities (for example, As or arsenic) at a higher concentration than the extension region. In FIG. 1, the extension regions and diffusion layers are not shown and the source/drain regions SD, which are their semiconductor regions, are shown.

A pair of extension regions and a pair of diffusion layers are formed in a way to sandwich the gate electrode G1 in a plan view and in the semiconductor substrate SB, the extension regions are located closer to the gate electrode G1 than the diffusion layers. Each source/drain region SD stretches nearly from beneath an end of the gate electrode G1 to the sidewall of the element isolation region IE. A sidewall SW, which includes an insulating film such as a silicon oxide film, is formed on each side of the gate electrode G1 in a self-alignment manner and the upper surface of the source/drain region SD is exposed from the sidewall SW.

A silicide layer is formed over the upper surfaces of the gate electrode G1 and source/drain regions SD in order to reduce contact resistance with a contact plug (coupling member) CP electrically coupled to their upper portions, though not shown in the figure. The silicide layer is, for example, a CoSi (cobalt silicon) film.

The upper portion of the MOSFET Q1 formed over the semiconductor substrate SB is covered, for example, by a stopper insulating film ES as a silicon nitride film and an interlayer insulating film IF, for example, as a silicon oxide film, is formed over the stopper insulating film ES. The upper surface of the interlayer insulting film IF is flattened by polishing. The thickness of the interlayer insulating film IF in a direction perpendicular to the main surface of the semiconductor substrate SB is 0.25 to 0.4 μm and for example, it is 0.25 μm.

A plurality of contact plugs CP penetrate the interlayer insulating film IF and stopper insulating film ES and are coupled to the gate electrode G1 and source/drain regions SD respectively. The contact plug CP coupled to the gate electrode G1 is located in a region not shown in the figure. Each contact plug CP includes a barrier conductor film BM1 and a main conductor film MC1 which are buried in a contact hole CH penetrating the interlayer insulating film IF and stopper insulating film ES.

For example, regarding the barrier conductor film BM1 and main conductor film MC1 which include the contact plug CP, the barrier conductor film BM1 is made of Ti (titanium) or TiN (titanium nitride) and the main conductor film MC1 is made of W (tungsten). The contact plug CP is column-shaped with a diameter of 50 nm. The minimum distance between neighboring contact plugs CP in the region not shown in the figure is 0.1 μm.

The inside surface of the contact hole CH is covered by the barrier conductor film BM1 and the inside of the contact hole CH is filled by the main conductor film MC1 through the barrier conductor film BM1. The upper surface of the contact plug CP is polished until it is flush with the upper surface of the interlayer insulating film IF.

A plurality of first wiring layers are formed over the interlayer insulating film IF and contact plugs CP. Each first wiring layer includes an interlayer insulating film L1 and a first layer wiring M1. A first layer wiring M1 is buried in a wiring ditch D1 made in the upper surface of the interlayer insulating film L1, and in the lower surface of each of some first layer wirings M1, a via V1 is formed as a conductor film buried in a via hole H1 and integrated with the first layer wiring M1. The interlayer insulating film L1 lies immediately over each of semiconductor elements including the MOSFET Q1 formed over the main surface of the semiconductor substrate SB.

The via V1 is intended to couple the first layer wiring M1 and the contact plug CP electrically. The thickness of the interlayer insulating film L1 is, for example, 0.3 μm. In other words, the length from the upper surface of the first layer wiring M1 to the bottom of the via V1 is, for example, 0.3 μm. The diameter of the via V1 is 50 nm, which is almost the same as that of the contact plug CP. For clarification of the boundary between the via V1 and the first layer wiring M1, FIG. 1 shows that the minimum width of the first layer wiring M1 is larger than the width of the via V1 FIG. 1; however, the width of the first layer wiring M1 may be almost the same as that of the via V1, namely it may be as small as 50 nm or so. The minimum width of the upper surface of the first layer wiring M1 is the same as the width of the bottom of a via V2 coupled to the upper surface.

Between the bottom of the interlayer insulating film L1 and the upper surface of the interlayer insulating film IF, a stopper insulating film may be formed to function as an etching stopper film in the process of making a via hole H1 penetrating the interlayer insulating film L1 on the bottom of the wiring ditch D1. For example, the material of the stopper insulating film may be silicon oxide film, silicon carbide film, or silicon nitride film. However, if the interlayer insulating film L1 is made of SiOC which has lower relative permittivity than silicon oxide film as in this embodiment, the stopper insulating film is omissible because the etching selectivity between the interlayer insulating film L1 and the interlayer insulating film IF is high enough.

As mentioned above, in the first wiring layer in this embodiment, the first layer wiring M1 and via V1 which penetrate the interlayer insulating film L1 are formed as an integrated conductor film by the so-called dual damascene method. The first layer wiring M1 extends in the depth direction of the figure and the via V1 is column-shaped. The surface of the wiring ditch D1 and the surface of the via hole H1 are covered by a barrier conductor film BM3, and a main conductor film MC3 is formed in the wiring ditch D1 and via hole H1 through the barrier conductor film BM3 and the first layer wiring M1 and via V1 are included of the barrier conductor film BM3 and main conductor film MC3. The main conductor film MC3 is made of Cu (copper) and the barrier conductor film BM3 is made of Ta (tantalum), TaN (tantalum nitride) or TiN (titanium nitride) or a laminated film of these materials.

An insulating film BIF, for example, as a silicon nitride film, is formed under, and in contact with, the back surface of the semiconductor substrate SB. In other words, the back surface of the semiconductor substrate SB is covered by the insulating film BIF.

Here, a through hole TH2 which penetrates the interlayer insulating films L1 and IF, stopper insulating film ES, semiconductor substrate SB, and insulating film BIF is formed and a barrier conductor film BM2 and a main conductor film MC2 are formed in the through hole TH2. The barrier conductor film BM2 and main conductor film MC2 include a through-silicon via (through-silicon electrode) TSV and a liner insulating film LF, which is integral with, and in the same layer as, the interlayer insulating film L1 is formed between the sidewall of the through-silicon via TSV and the interlayer insulating film IF, stopper insulating film ES, semiconductor substrate SB, and insulating film BIF. In other words, the liner insulating film LF is an SiOC film like the interlayer insulating film L1. The main conductor film MC2 is made of Cu (copper) and the barrier conductor film BM2 is made of Ta (tantalum), TaN (tantalum nitride) or TiN (titanium nitride) or a laminated film of these materials.

In order to suppress capacitance between the semiconductor substrate SB and through-silicon via TSV, the liner insulating film LF lies between the semiconductor substrate SB and through-silicon via TSV in a way to cover the inside surface of the through hole TH1 which penetrates the interlayer insulating film IF, stopper insulating film ES, semiconductor substrate SE, and insulating film BIF. In other words, the through hole TH2 is an opening which penetrates the liner insulating film LF formed in the through hole TH1 from its top to bottom. The through-silicon via TSV and semiconductor substrate SB are electrically insulated from each other by the liner insulating film LF surrounding the sidewall of through-silicon via TSV.

The through-silicon via TSV is a via as a conductive path for electrical coupling among different types of devices in a three-dimensional multifunctional device manufactured by stacking a plurality of semiconductor chips vertically. The through-silicon via TSV is intended to increase the speed of electric current which flows in it and decrease power consumption and is formed with a much larger diameter than the contact plug CP to decrease its resistance. The width of the through-silicon via TSV in a direction along the main surface of the semiconductor substrate SB is 3 to 10 μm and for example, it is 6 μm. In other words, the opening of the through hole TH2 has a diameter of 6 μm.

If the liner insulating film LF is simply intended to insulate the semiconductor substrate SB and through-silicon via TSV from each other, the liner insulating film LF may be a silicon oxide film with a thickness of 0.2 μm or so. On the other hand, in this embodiment, in order to increase the speed of electric current flowing in the through-silicon via TSV, the liner insulating film LF is made of SiOC, a low-k material with lower relative permittivity than silicon oxide in order to reduce capacitance between the semiconductor substrate SB and through-silicon via TSV.

For further reduction of capacitance, the thickness of the liner insulating film LF is relatively large, for example, about 1 μm. The thickness of the liner insulating film LF here refers to the thickness of the liner insulating film LF in the through hole TH1 in a direction perpendicular to the inner wall of the through hole TH1. As mentioned above, the thickness of the liner insulating film LF is, for example, 1 μm, so the diameter of the opening of the through hole TH1 is, for example, 8 μm.

In order to use the liner insulating film LF covering the sidewall of the through-silicon via TSV as an interlayer insulating film L1 for the first wiring layer, the upper surface of the through-silicon via TSV is flush with the upper surface of the first layer wiring M1 buried in the wiring ditch D1 in the upper surface of the first wiring layer.

A second wiring layer is formed over each of the interlayer insulating film L1, first layer wiring M1, and through-silicon via TSV. The second wiring layer includes a second layer wiring M2 and via V2 which are structurally the same as in the first wiring layer. The second layer wiring M2 and via V2 are formed in a way to penetrate a laminated insulating film included of a barrier insulating film BF2 and an interlayer insulating film L2 which are stacked sequentially over the interlayer insulating film L1. The interlayer insulating film L2 is a low-k film, for example, an SiOC film and the barrier insulating film BF2 is an anti-diffusion film, for example, a silicon nitride film.

The second layer wiring M2 and via V2 are formed as an integrated conductor film by the dual damascene method like the first layer wiring M1 and via V1. Specifically a wiring ditch D2 is made in the upper surface of the interlayer insulating film L2 and a main conductor film MC4 is formed inside the ditch through a barrier conductor film BM4. The barrier conductor film BM and main conductor film MC4 include the second layer wiring M2. Also, a via hole H2 which penetrates the interlayer insulating film L2 and barrier insulating film BF2 is made on the bottom of the wiring ditch D2 to expose the upper surface of the through-silicon via TSV. The main conductor film MC4 lies inside the via hole H2 through the barrier conductor film BM4 and the barrier conductor film BM4 and main conductor film MC4 include the via V2. The second layer wiring M2 is electrically coupled to the first layer wiring M1 or through-silicon via TSV through the via V2. For example, the diameter of the via V2 is 50 nm and the diameter of the through-silicon via TSV is 6 μm, so in a region where the via V2 is not in contact with the through-silicon via TSV, the upper surface of the through-silicon via TSV is in contact with the overlying insulating film. If the through-silicon via TSV should be in direct contact with the bottom of the interlayer insulating film L2 as an SiOC film, Cu (copper) in the main conductor film MC2 of the through-silicon via TSV might diffuse into the interlayer insulating film L2 and cause deterioration in the insulation quality of the interlayer insulating film L2, resulting in shorting between wirings.

Also, since the area of the upper surface of the extending first layer wiring M1 which is exposed from the via V2 is considerably large, if the first layer wiring M1 should be in contact with the interlayer insulating film L2, Cu (copper) in the first layer wiring M1 might diffuse into the interlayer insulating film L2 as in the above case.

For this reason, the second wiring layer has a barrier insulating film BF2 between the interlayer insulating film L2 and interlayer insulating film L1, unlike the first wiring layer. Since the barrier insulating film BF2, made of silicon nitride or silicon carbide, is a high density film, it prevents diffusion of Cu (copper) in the through-silicon via TSV and first-layer wiring M1 into the interlayer insulating film L2. Similarly the barrier conductor films BM1 to BM4 prevent diffusion of metal in the main conductor films MC1 to MC4 into the interlayer insulating films.

As will be explained by giving a comparative example later, a possible approach to preventing diffusion of Cu (copper) from the upper surface of the through-silicon via TSV into the interlayer insulating film over the through-silicon via TSV is that a pad as a conductor film with a diameter large enough to cover the upper surface of the through-silicon via TSV is formed in a way to be in contact with the upper surface of the through-silicon via TSV. On the other hand, in this embodiment, no conductor film with a diameter not less than that of the through-silicon via TSV is in contact with the upper surface of the through-silicon via TSV and instead the via V2 and barrier insulating film BF2 are in contact with it.

As shown in FIG. 1, a plurality of second layer wirings M2 electrically coupled to the through-silicon via TSV through vias V2 and a plurality of second layer wirings not electrically coupled to the through-silicon via TSV are formed in the upper surface of the interlayer insulating film L2 immediately over the through-silicon via TSV. In other words, the second layer wirings electrically coupled to the through-silicon via TSV and the second layer wirings not electrically coupled to the through-silicon via TSV are isolated from each other.

A plurality of wiring layers are stacked over the second wiring layer although the layers over the second wiring layer are not shown in the figure, and bump electrodes made of Au (gold), solder or the like are formed over the uppermost layer. At least six wiring layers, including the first and second wiring layers, are formed. The bump electrodes are intended to couple the semiconductor chip including the semiconductor substrate SB to a redistribution wiring layer or printed circuit board.

As explained above, the semiconductor chip in this embodiment includes a semiconductor substrate with a semiconductor element formed on its main surface and a through-silicon via penetrating the semiconductor substrate, in which a liner insulating film formed on the sidewall of the through-silicon via is used as an interlayer insulating film for a first wiring layer which covers the upper portion of the semiconductor element. The semiconductor chip includes a plurality of wiring layers stacked over the main surface of the semiconductor substrate and has bump electrodes on its upper surface and the bottom of the through-silicon via is exposed on the back surface of the semiconductor substrate.

A three-dimensional multifunctional device is manufactured by stacking a plurality of semiconductor chips as mentioned above vertically, in which semiconductor chips stacked vertically one upon another are made conductive to each other by coupling a bump electrode on the upper surface of one semiconductor chip to a through-silicon via exposed on the bottom of the other semiconductor chip. Thus the through-silicon via is used as a path for an electric signal between stacked semiconductor chips.

Next, a semiconductor device in which the liner insulating film is not used as an interlayer insulating film for the first wiring layer and a pad completely covers the upper surface of the through-silicon via will be described as a comparative example to explain the effects of this embodiment.

The manufacturing process for the semiconductor device as a comparative example will be described below referring to FIGS. 14 to 21. The semiconductor device as the comparative example adopts the via middle method to form a through-silicon via. FIGS. 14 to 21 are sectional views illustrating the manufacturing process for the semiconductor device as the comparative example.

Figure 14:
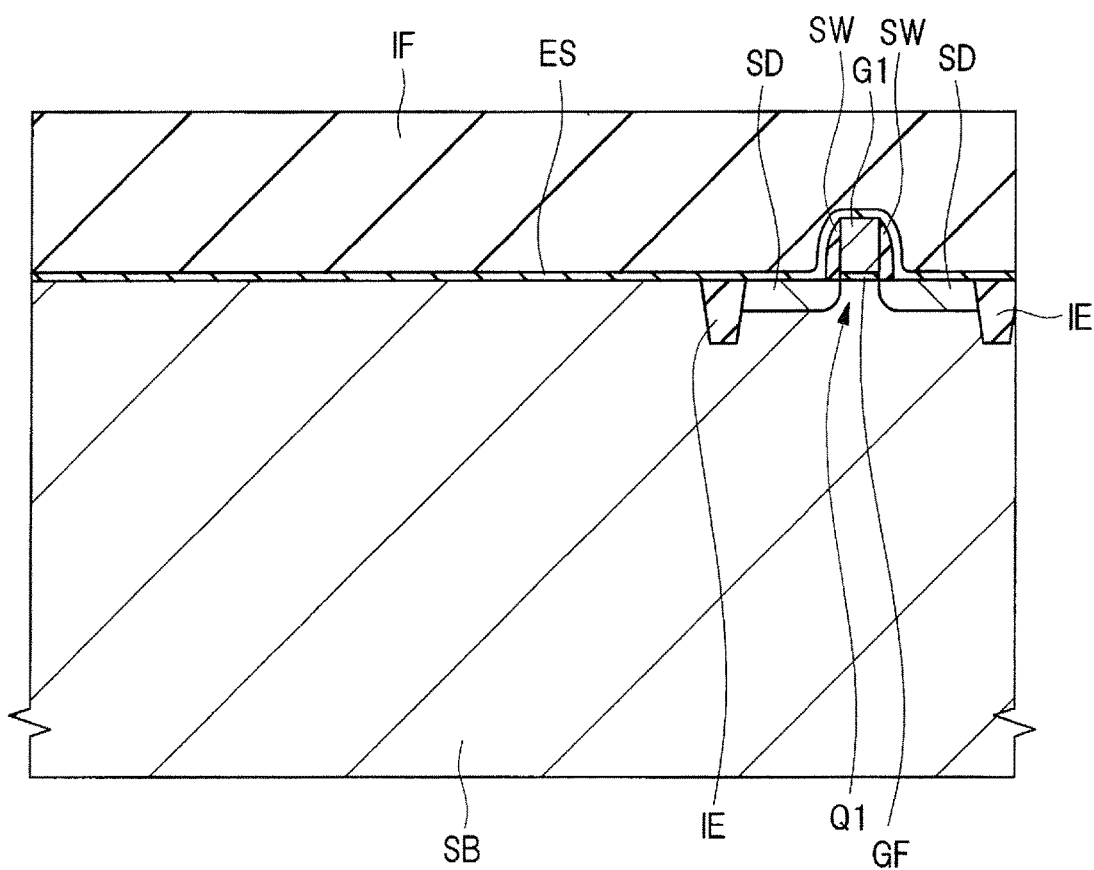
FIG. 14 is a sectional view showing a manufacturing step for a semiconductor device as a comparative example.

As shown in FIG. 14, a semiconductor substrate SB is provided. Then, after an element isolation region IE, for example, having an STI structure, is formed in the main surface of the semiconductor substrate SB, a MOSFET Q1 including a gate electrode G1 and source/drain regions SD is formed over the area of the main surface of the semiconductor substrate SB which is exposed from the element isolation region IE. Here, detailed explanation of the process of forming the MOSFET Q1 is omitted. The semiconductor element formed over the semiconductor substrate is not limited to a MOSFET but it may be a bipolar transistor, diode, nonvolatile memory, capacitive element or resistive element. The height from the main surface of the semiconductor substrate SB to the upper surface of the gate electrode G1 is, for example, 0.15 μm.

After that, a silicide layer (not shown) is formed over the upper surfaces of the gate electrode G1 and source/drain regions SD using the known salicide technology, then a stopper insulating film ES and an interlayer insulating film IF are formed over the semiconductor substrate SB sequentially, for example, using the CVD (Chemical Vapor Deposition) method, in a way to cover the silicide layer and MOSFET Q1. The stopper insulating film ES is made of silicon nitride and the interlayer insulating film IF is made of silicon oxide. Then, the upper surface of the interlayer insulating film IF is flattened by the CMP (Chemical Mechanical Polishing) method.

Figure 15:
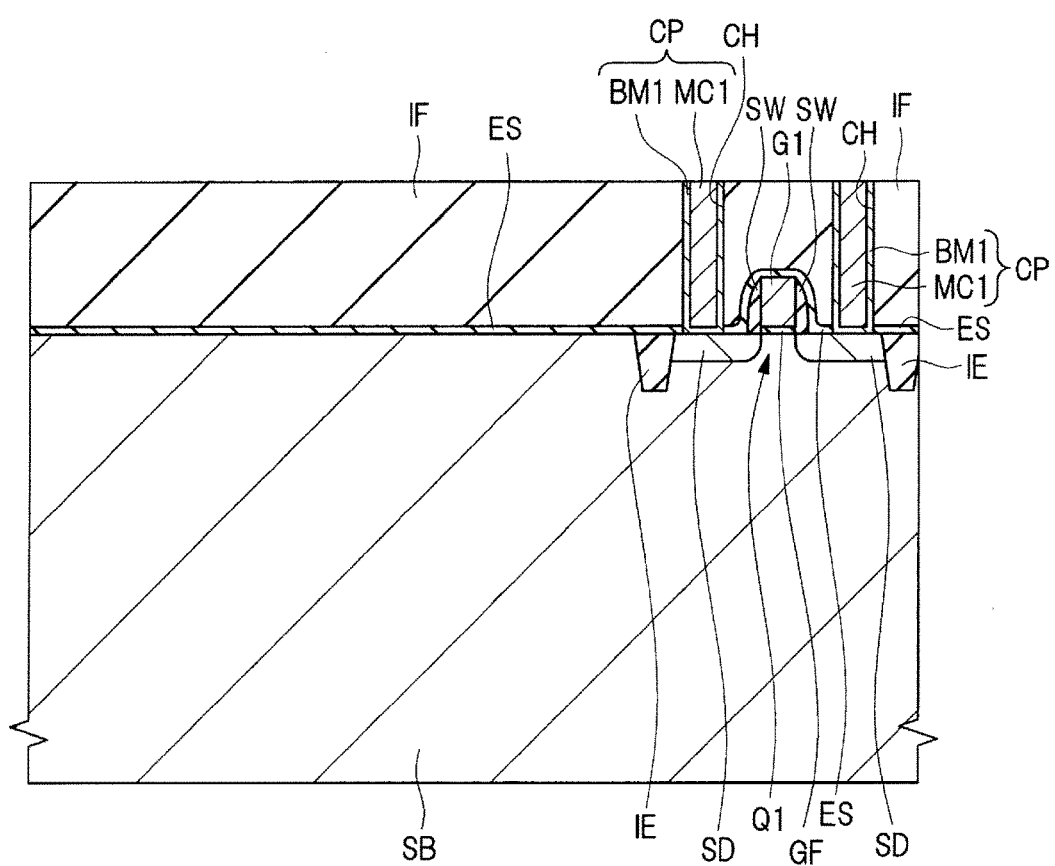
FIG. 15 is a sectional view showing a manufacturing step following the step shown in FIG. 14.

Next, as shown in FIG. 15, a plurality of contact holes CH are made and a plurality of contact plugs CP to be electrically coupled to the gate electrode G1 and the source/drain regions SD respectively are formed as buried in the contact holes CH. Here the contact plugs coupled to the gate electrode G1 is not shown.

Figure 16:
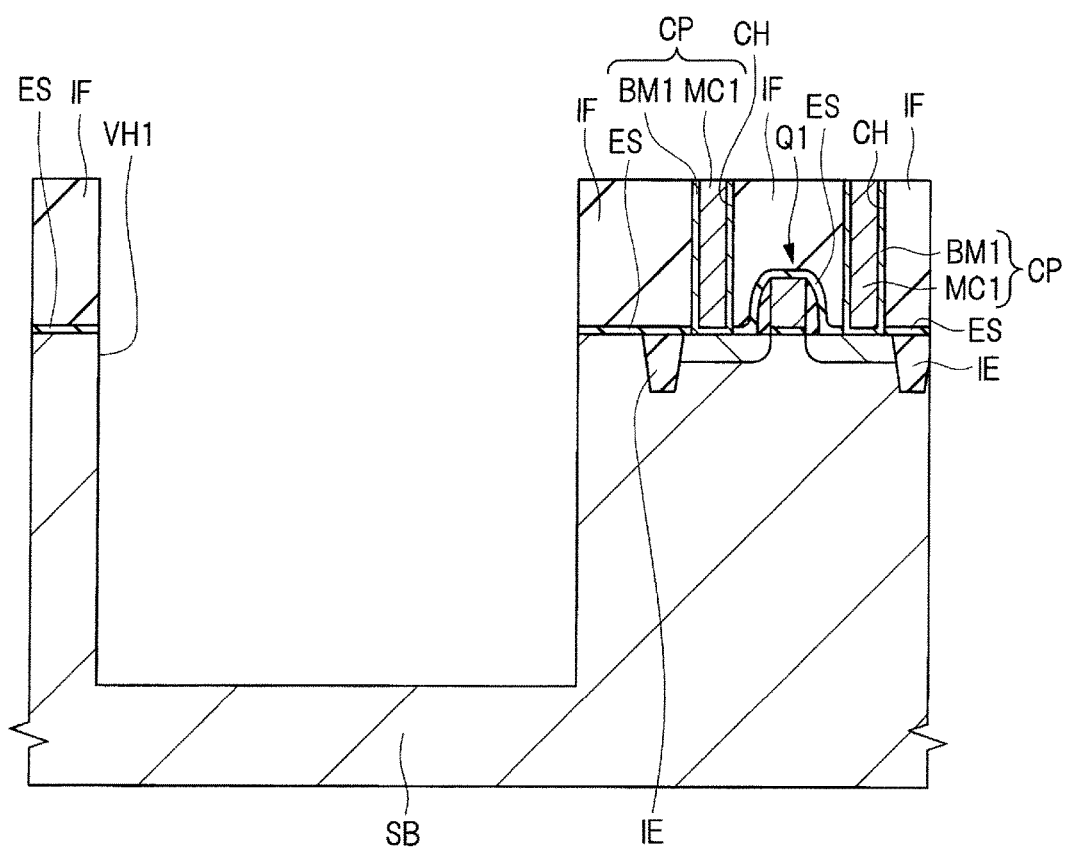
FIG. 16 is a sectional view showing a manufacturing step following the step shown in FIG. 15.

Next, as shown in FIG. 16, a via hole VH1 is made which penetrates the interlayer insulating film IF and stopper insulating film ES and reaches a given depth in the semiconductor substrate SB.

Figure 17:
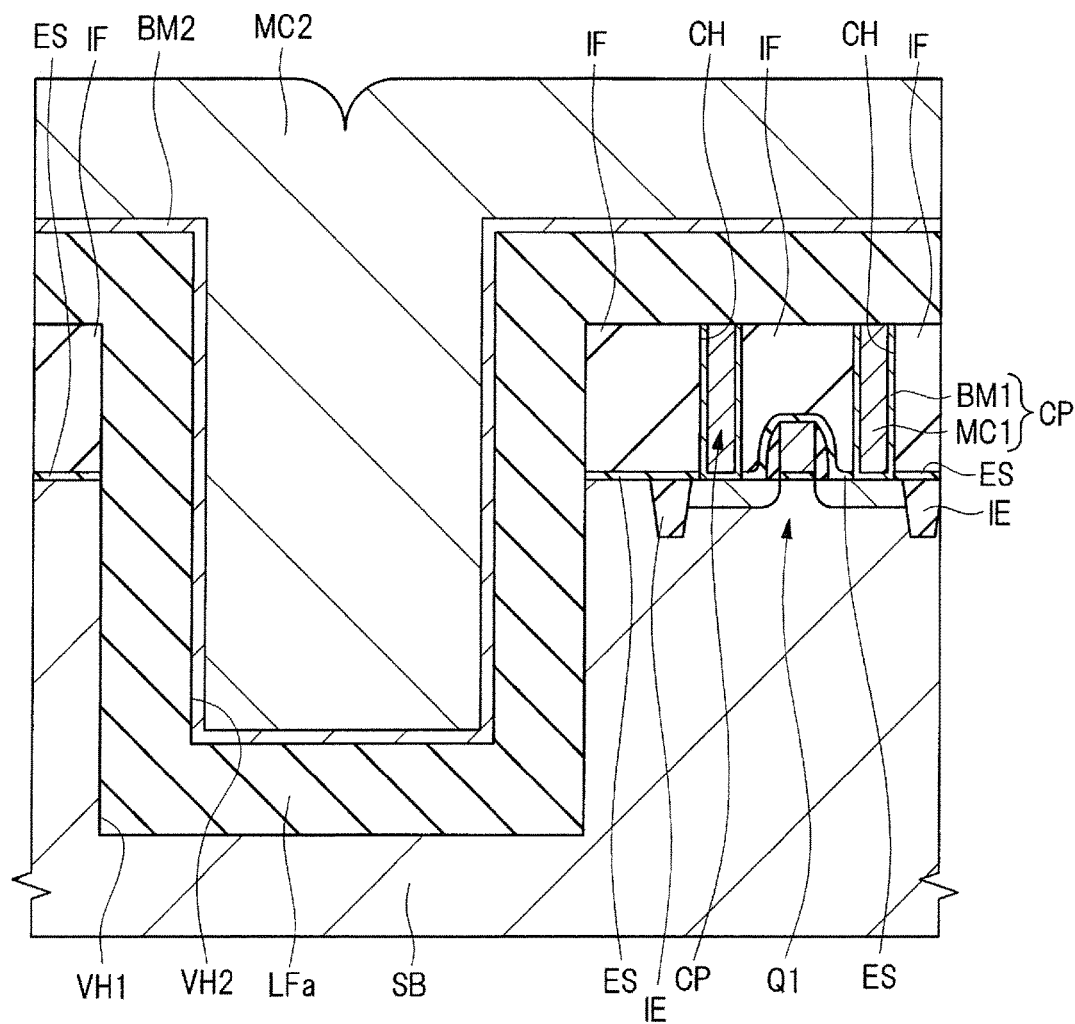
FIG. 17 is a sectional view showing a manufacturing step following the step shown in FIG. 16.

Next, as shown in FIG. 17, a liner insulating film LFa, a barrier conductor film BM2, and a main conductor film MC2 are formed over the upper surface of the semiconductor substrate SB sequentially so as to fill the inside of the via hole VH1 completely. The liner insulating film LFa is made of SiOC and its thickness is, for example, 1 μm. Here, the thickness of the liner insulating film LFa is relatively large at about 1 μm in order to reduce capacitance between the semiconductor substrate SB and the through-silicon via to be formed later. The liner insulating film LFa in the via hole VH1 has, in its inside, a via hole VH2 in which the barrier conductor film BM2 and main conductor film MC2 are buried. The barrier conductor film BM2 is a Ta (tantalum) film formed, for example, by sputtering and the main conductor film MC2 is a Cu (copper) film formed by plating.

Figure 18:
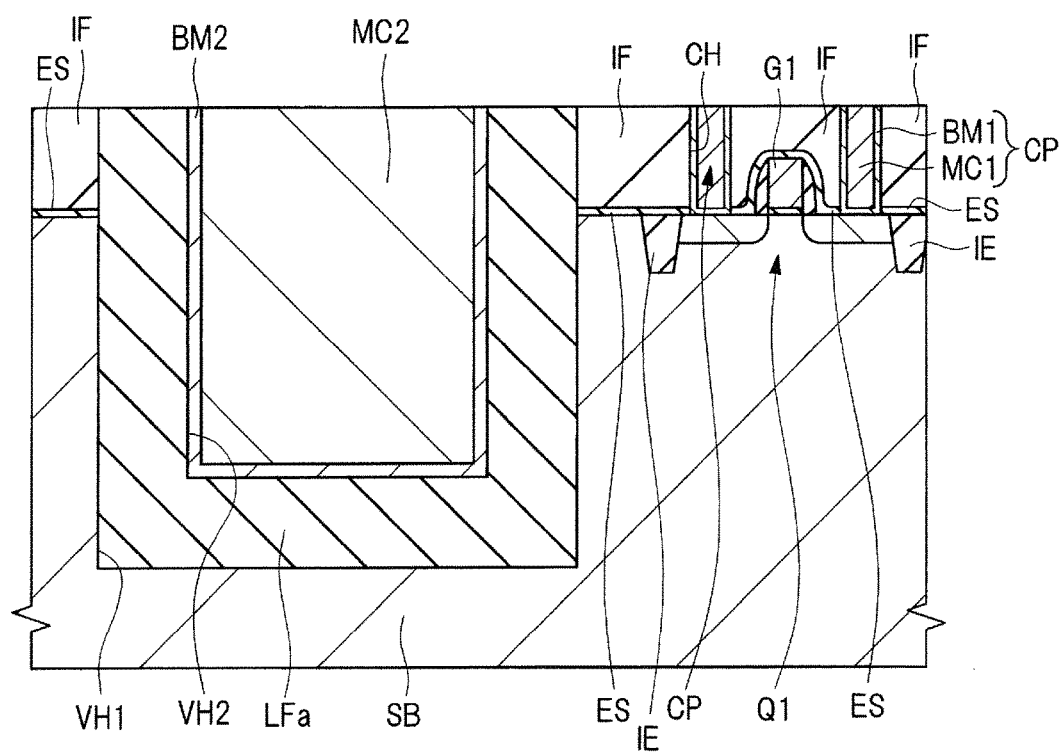
FIG. 18 is a sectional view showing a manufacturing step following the step shown in FIG. 17.

As shown in FIG. 18, the liner insulating film LFa, barrier conductor film BM2, and main conductor film MC2 are polished by the CMP method to expose the upper surface of the interlayer insulating film IF and the upper surfaces of the contact plugs CP so that the barrier conductor film BM2 and main conductor film MC2 are left in the via hole VH1 through the liner insulating film LFa. The plug included of the barrier conductor film BM2 and main conductor film MC2 has a width of 3 to 10 μm and for example, it is 6 μm.

In the step of polishing by the CMP method, it is difficult to stop polishing at the instant that the layer under the film to be polished is exposed by polishing the film, and polishing does not stop even after the underlying layer is exposed.

In that case, over-polishing might cause the upper surface of the underlying layer to become recessed by the amount equivalent to approximately 10% of the thickness of the overlying film to be polished. Specifically, if the insulating film to be removed is relatively thick (about 1 μm in thickness), the upper surfaces of the interlayer insulating film IF and contact plugs CP might be polished and recessed by 0.1 μm, equivalent to 10% of the thickness (1 μm) of the liner insulating film LFa, resulting in a decrease in the thickness of the interlayer insulating film IF.

If that is the case, the MOSFET Q1 and the upper surface of the interlayer insulating film IF would come closer to each other, so the wiring formed over the interlayer insulating film IF and some part of the semiconductor element (for example, the gate electrode G1) might come closer to each other, causing shorting between them.

Figure 19:
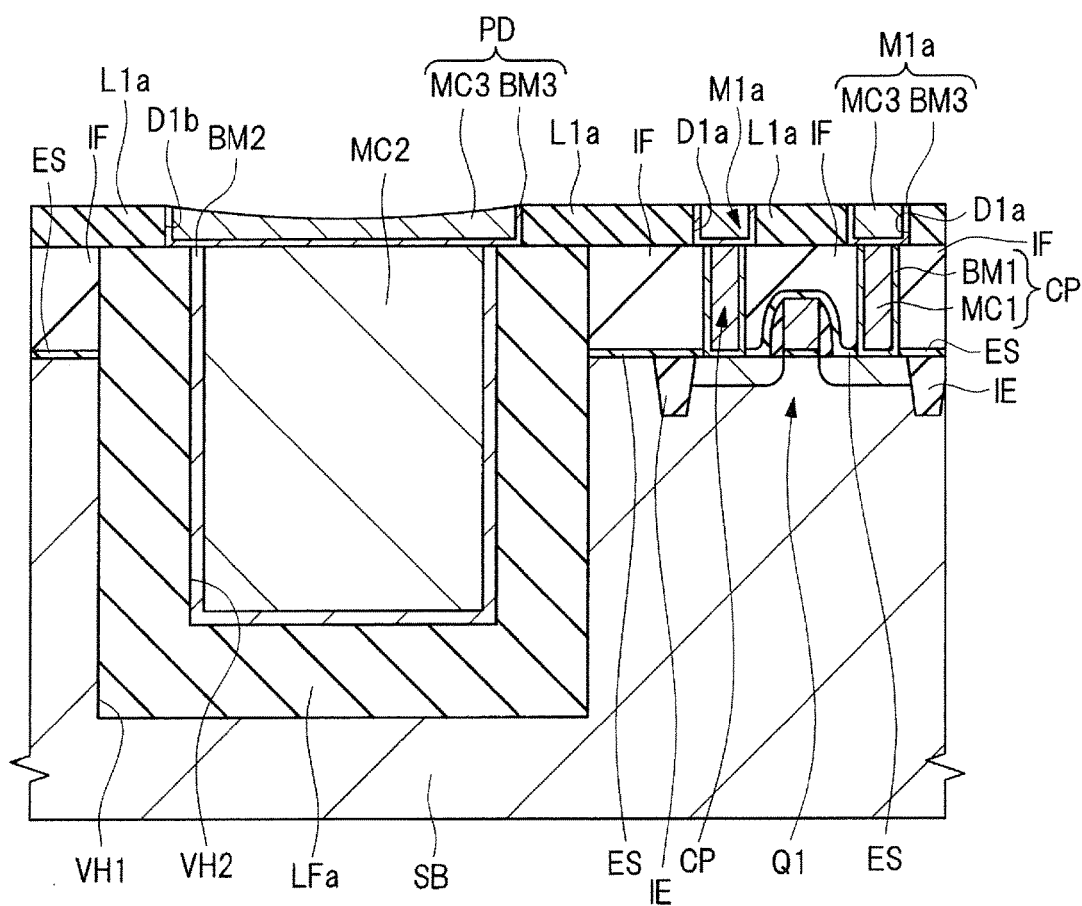
FIG. 19 is a sectional view showing a manufacturing step following the step shown in FIG. 18.

Next, as shown in FIG. 19, a first wiring layer including a wiring layer formed using the known single damascene method is formed over the interlayer insulating film IF, contact plugs CP, liner insulating film LFa, barrier conductor film BM2, and main conductor film MC2, the upper surfaces of which are made flush with each other. The first wiring layer includes an interlayer insulating film L1a, in which a first layer wiring M1a is formed in a ditch D1a as an opening in the interlayer insulating film L1a which exposes the upper surface of a contact plug CP. Also, the first wiring layer has a pad PD buried in a ditch D1b as an opening in the interlayer insulating film L1a which exposes the main conductor film MC2. The interlayer insulating film L1a is a low-k film made of SiOC.

The first layer wirings M1a and pad PD are included of a barrier conductor film BM3 and a main conductor film MC3 which are sequentially buried in the ditches D1a and D1b respectively. The ditches D1a and D1b are openings made by the photolithographic technique and the dry etching method. The width of the pad PD is 5 to 10 μm and for example, it is 10 μm.

The pad PD is formed in a way to completely cover the upper surface of the plug included of the underlying barrier conductor film BM2 and main conductor film MC2. It is intended to prevent diffusion of Cu (copper) in the main conductor film MC2 into the interlayer insulating film L1a or the like due to contact between the main conductor film MC2 and the interlayer insulating film L1a. Also, taking into consideration the possibility of misalignment in the lithographic process, the pad PD pattern is formed so as to be larger than the upper surface of the plug.

A possible approach to preventing diffusion of Cu (copper) may be to form a barrier insulating film, for example, made of silicon nitride between the upper surface of the plug including the main conductor film MC2 and the bottom of the interlayer insulating film L1a, but a high density film capable of preventing diffusion of Cu (copper) has high relative permittivity, so in this case no such barrier insulating film (anti-diffusion film) is formed.

Specifically, if a barrier insulating film (anti-diffusion film) is formed in contact with the upper surface of the interlayer insulating film IF covering the MOSFET Q1, capacitance between the MOSFET Q1 and the wiring in the first wiring layer would increase, causing a drop in the operating speed of the semiconductor element or an increase in power consumption. Therefore, from the viewpoint of prevention of deterioration in semiconductor device performance, for the semiconductor device as the comparative example, it is not realistic to form a barrier insulating film instead of a pad PD in order to prevent diffusion of Cu (copper). For this reason, in the semiconductor device as the comparative example, a pad PD wide enough to cover the upper surface of the plug included of the barrier conductor film BM2 and main conductor film MC2 is formed in the first wiring layer.

While the width of the first layer wiring M1a is about 50 nm, the width of the pad PD is 10 μm, or comparatively very large. When forming the first wiring layer with these conductor films buried therein, first a barrier conductor film BM3 is formed over the interlayer insulating film L1a with ditches D1a and D1b made therein by sputtering or another method, then a main conductor film MC3 is formed by plating or the like so as to fill the ditches D1a and D1b. Then, excessive portions of the barrier conductor film BM3 and main conductor film MC3 over the interlayer insulating film L1a are removed by polishing so that the barrier conductor film BM3 and main conductor film MC3 are left only inside the ditches D1a and D1b.

In the process of forming the pad PD included of the barrier conductor film BM3 and main conductor film MC3 in the ditch D1b as mentioned above, the pad PD, which has a large area, and the first layer wirings M1 as fine wiring patterns are polished in the same step of polishing by the CMP method for removal of excessive conductor film. As a consequence, due to the dishing characteristics of the CMP method, the central portion of the pad PD becomes thin, namely the central portion of the upper surface of the pad PD becomes recessed.

Figure 20:
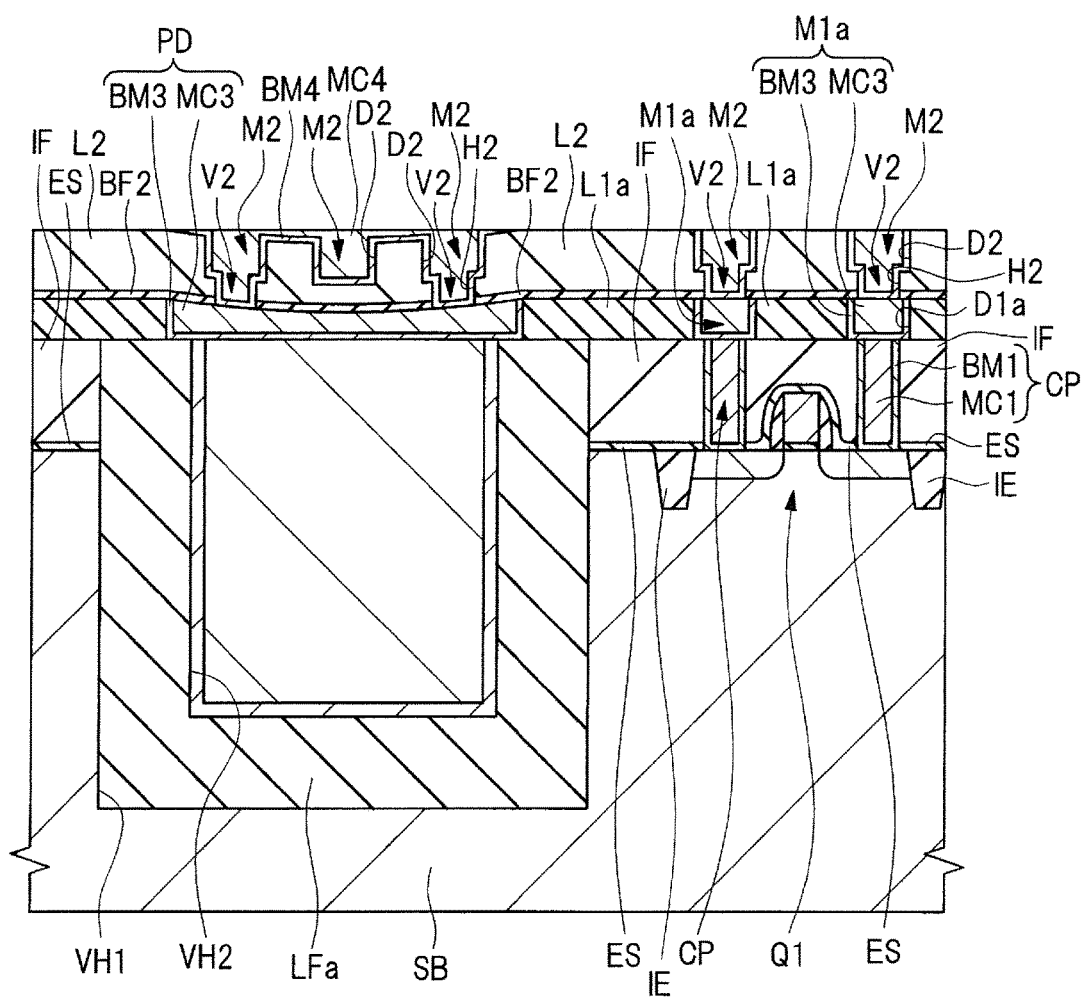
FIG. 20 is a sectional view showing a manufacturing step following the step shown in FIG. 19.

Next, as shown in FIG. 20, a second wiring layer is formed over the interlayer insulating film L1a, first layer wirings M1a and pad PD. The second wiring layer includes a laminated film formed by stacking a barrier insulating film BF2 and an interlayer insulating film L2 over the interlayer insulating film L1a sequentially, and second layer wirings M2 and vias V2 which are formed in the holes penetrating the laminated film by the dual damascene method.

For the formation of the second wiring layer, first a barrier insulating film BF2 and an interlayer insulating film L2 are formed over the interlayer insulating film L1a sequentially, for example, by the CVD method. Here, since the upper surface of the pad PD has a recess, the upper surface of the interlayer insulating film L2 formed (deposited) directly on it will have a recess similarly.

After that, wiring ditches D2 and via holes H2 to expose the upper surfaces of the pad PD and first layer wirings M1a are formed by the photolithographic technique and etching method. Then, a barrier conductor film BM4 and a main conductor film MC4 are buried in the wiring ditches D2 and via holes H2 by sputtering and plating. Then, excessive portions of the barrier conductor film BM4 and main conductor film MC4 over the interlayer insulating film L2 are removed by the CMP method to expose the upper surface of the interlayer insulating film L2 so that second layer wirings M2 and vias V2 which are included of the barrier conductor film BM4 and main conductor film MC4 are formed in the wiring ditches D2 and via holes H2 respectively.

At this time, in the step of polishing by the CMP method in order to remove excessive portions of the main conductor film MC4, all excessive film cannot be removed but some excessive film may be left in the recess of the upper surface of the interlayer insulating film L2 which has been formed due to the recess of the pad PD.

After that, though not shown in the figure, a plurality of wiring layers are formed over the second wiring layer, and bump electrodes are formed in the uppermost layer for coupling to a redistribution wiring layer or printed circuit board. This concludes the wafer front-end process.

Figure 21:
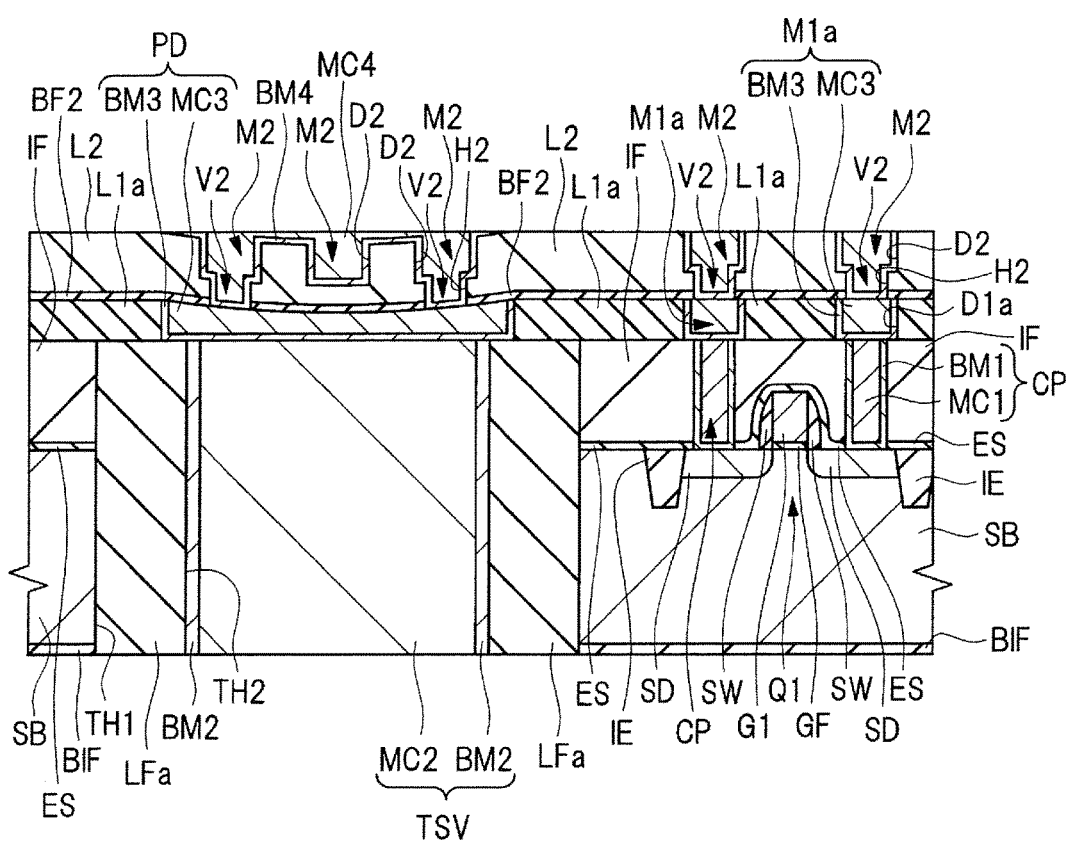
FIG. 21 is a sectional view showing a manufacturing step following the step shown in FIG. 20.

Next is the back-end process shown in FIG. 21. In the via middle method, since the bottom of the plug included of the main conductor film MC2 and barrier conductor film BM2 to include a through-silicon via later is at a depth in the semiconductor substrate SB, the back surface of the semiconductor substrate SM must be polished to expose the bottom of the plug. In this case, first the back surface of the semiconductor substrate SB is ground by a wafer grinding apparatus to decrease the thickness of the semiconductor substrate SB, then the semiconductor substrate SB is etched by dry etching so that the bottom of the plug protrudes from the back surface of the semiconductor substrate SB.

After that, an insulating film BIF is formed in a way to cover the back surface of the semiconductor substrate SB. Then, a through hole TH1 which penetrates the interlayer insulating film IF, stopper insulating film ES, and semiconductor substrate SB is formed by polishing the plug protruding from the back surface of the semiconductor substrate SB by the CMP method or the like and a through-silicon via TSV included of the main conductor film MC2 and barrier conductor film BM2 is formed in the through hole TH1 through the liner insulating film LFa. Thus the semiconductor chip including the through-silicon via TSV in the comparative example is completed.

In the semiconductor device as the comparative example, in order to reduce parasitic capacitance on the through-silicon via TSV, the liner insulating film LFa which covers the sidewall of the through-silicon via TSV is made of material with low relative permittivity and the thickness of the liner insulating film LFa is increased.

Figure 22:
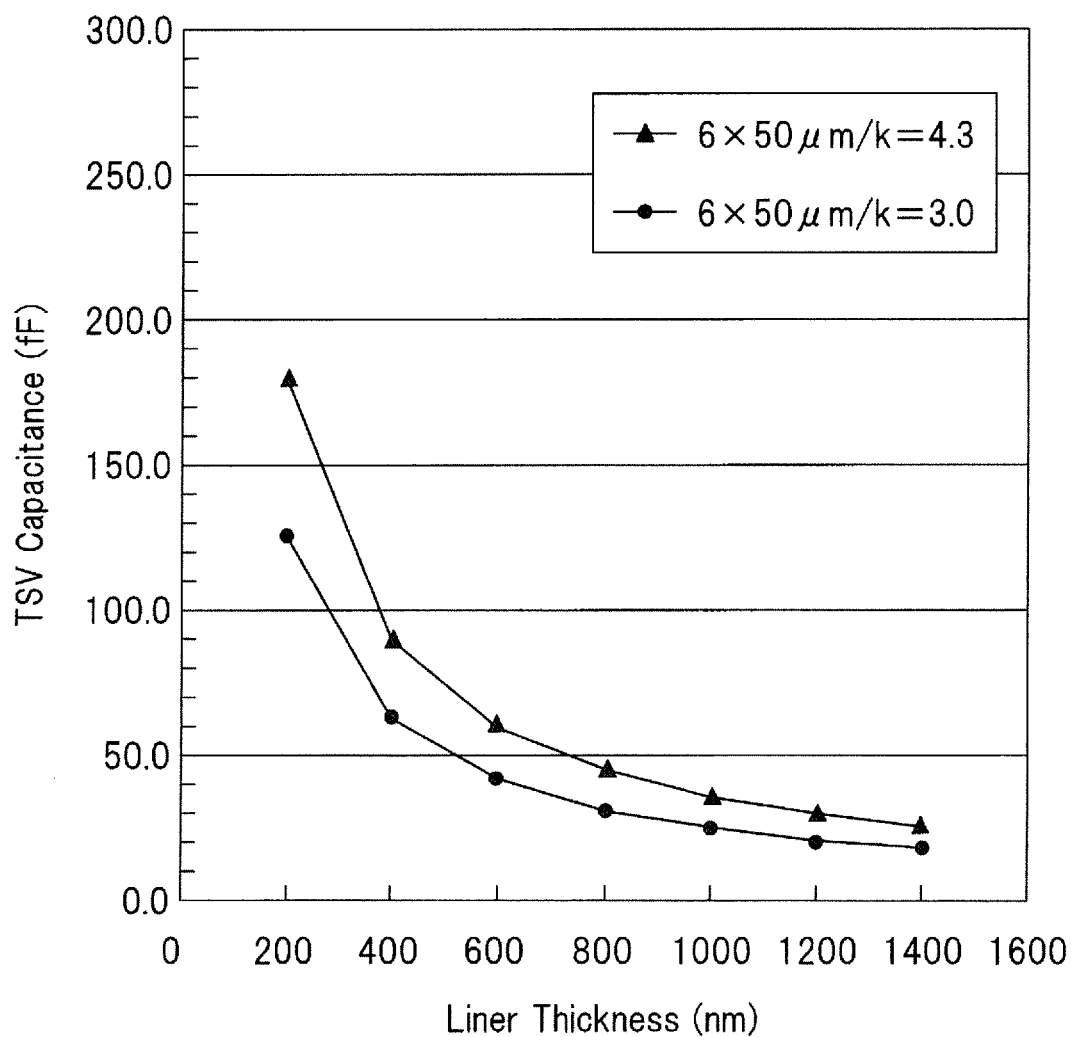
FIG. 22 is a graph showing the relation between liner insulating film thickness and through-silicon via parasitic capacitance.

FIG. 22 is a graph showing the relation between liner insulating film thickness and through-silicon via parasitic capacitance. In the graph of FIG. 22, the horizontal axis denotes liner insulating film thickness and the vertical axis denotes capacitance between the liner insulating film and semiconductor substrate. Here, the plot with triangles represents a case that relative permittivity k is 4.3, namely the liner insulating film is a silicon oxide film and the plot with black circles represents a case that relative permittivity k is 3.0, namely the liner insulating film is an SiOC film. In this example, the through-silicon via is 6 μm in diameter and 50 μm in height. The graph indicates that when the liner insulating film is thicker, parasitic capacitance on the through-silicon via is smaller. Also, the use of an insulating film with low relative permittivity (low-k) decreases parasitic capacitance on the through-silicon via.

For example, when the liner insulating film is a silicon oxide film, the relative permittivity is 4.3, and in this case, if the liner insulating film thickness is 200 nm, the parasitic capacitance is 180 fF. On the other hand, when the liner insulating film is an SiOC film, the relative permittivity is 3.0, and if the liner insulating film thickness is 1 μm, the parasitic capacitance is low at 25 fF. Therefore, the semiconductor device as the comparative example uses a liner insulating film with a thickness of about 1 μm in order to reduce parasitic capacitance on the through-silicon via TSV (see FIG. 21). If a silicon oxide film with higher relative permittivity is used to reduce parasitic capacitance to 25 fF, the liner insulating film thickness must be about 1.5 μm, as can be understood from the graph.

Although parasitic capacitance can be reduced by increasing the thickness of the liner insulating film LFa, in the step of polishing the liner insulating film LFa over the interlayer insulating film IF by the CMP method, the increased thickness of the liner insulating film LFa to be polished may cause a problem that the amount of over-polishing of the underlying layer increases, resulting in an increase in the amount of grinding of the interlayer insulating film IF as a contact layer. Consequently, the decrease in the thickness of the interlayer insulating film IF may cause a problem that shorting is likely to occur between the gate electrode G1 and first layer wiring M1a.

For example, if the liner insulating film thickness is about 200 nm, even when in the step illustrated in FIG. 18 the liner insulating film over the interlayer insulating film IF is polished and removed by the CMP method, the underlying interlayer insulating film IF is hardly polished. Specifically, if the amount of over-polishing in the polishing step to expose the surface of the interlayer insulating film IF is assumed to be 10% of the thickness of the film to be polished, the amount of grinding of the upper surface of the interlayer insulating film IF as a contact layer is 10% of the thickness of the liner insulating film, or 20 nm.

The thickness of the interlayer insulating film IF depends on the aspect ratio of the contact hole CH and for a desirable yield, the aspect ratio must be 5 or less. So, if the contact hole diameter is 50 nm, the thickness of the interlayer insulating film IF should be 250 nm. When the thickness of the interlayer insulating film IF is to be larger than this, the diameter of the contact plug CP must be larger, which makes it difficult to miniaturize the semiconductor device. If the gate electrode height is 150 nm, the distance between the interlayer insulating film IF's upper surface polished in the step of polishing the liner insulating film and the gate electrode G1's upper surface is (250-150)=80 nm, so even in consideration of fluctuation in the amount of polishing it may be thought that shorting does not occur.

On the other hand, as explained in reference to FIGS. 14 to 21 by the comparative example, if the thickness of the liner insulating film LFa is increased to 1 μm, the amount of grinding of the upper surface of the interlayer insulating film IF due to over-polishing in the step of polishing by the CMP method is 100 nm. In this case, after the polishing step, the distance between the upper surface of the interlayer insulating film IF and the upper surface of the gate electrode G1 is (250-150)-100=0 nm, which means that the upper surface of the gate electrode G1 is exposed. Even taking it into consideration that the thickness of the liner insulating film LFa may fluctuate about ±5%, the amount of over-polishing of the interlayer insulating film IF is ±50 nm, so the gate electrode G1 is very likely to be exposed from the upper surface of the interlayer insulating film IF.

As explained above, if the liner insulating film thickness is increased to about 1 μm in order to reduce parasitic capacitance, due to over-polishing by the CMP method, shorting would be likely to occur between the gate electrode and first layer wiring, leading to a decline in the reliability of the semiconductor device.

When the thickness of the liner insulating film LFa is increased, the amount of grinding of the liner insulating film LFa over the liner insulating film IF must be increased, thereby leading to a rise in manufacturing cost. In addition, if the amount of grinding is larger, unevenness in polishing by the CMP method may be increased and it may be difficult to flatten the film surface uniformly by polishing.

As shown in FIG. 20, since the pad PD coupled to the through-silicon via TSV has a large area, as its upper surface is polished by the CMP method, the central portion of the upper surface of the pad PD is recessed due to dishing characteristics. For this reason, wiring formation defects may occur in the second wiring layer over the pad PD and further wiring layers over it and as shown in FIG. 20, neighboring wirings become conductive to each other through metal film left in a recess over the wirings. For example, as mentioned above, the barrier conductor film BM4 and main conductor film MC4 formed in the recess of the upper surface of the interlayer insulating film L2 are not removed in the polishing step by the CMP method but remain united with the underlying second layer wiring M2. Therefore, the formation of a large pad PD with a diameter larger than that of the through-silicon via TSV may cause shorting between overlying wirings.

Therefore, in the semiconductor device according to this embodiment, as shown in FIG. 1, when the thickness of the liner insulating film LF is relatively large at about 1 μm, the liner insulating film LF is used as an interlayer insulating film L1 for the first wiring layer and a pad which covers the through-silicon via TSV is not formed.

Here, the liner insulating film LF as a low-k film including SiOC film is left over the interlayer insulating film IF, which prevents a decrease in the thickness of the interlayer insulating film IF due to polishing by the CMP method and shorting between a semiconductor element such as the MOSFET Q1 and a first layer wiring M1 in the first wiring layer. Consequently the reliability of the semiconductor device is improved.

Furthermore, since the low-k liner insulating film LF is used as the interlayer insulating film L1 for the first wiring layer and its thickness is large at about 1 μm, wiring parasitic capacitance is reduced and also since the etching selectivity between the interlayer insulating film L1 and interlayer insulating film IF is high, it is unnecessary to provide, between the interlayer insulating film L1 and interlayer insulating film IF, an etching stopper film which may cause an increase in capacitance between the wiring and element. Consequently the performance of the semiconductor device is improved.

In this embodiment, no pad PD (see FIG. 21) is formed and a via V2 for a second layer wiring is directly coupled to the upper surface of the through-silicon via TSV (see FIG. 1). Here, the area of the upper surface of the through-silicon via TSV which is exposed from the via V2 is covered by the barrier insulating film BF2, so Cu (copper) in the through-silicon via TSV does not diffuse into the interlayer insulating film though there is no pad PD. In this embodiment, since there is no need to form a large pad PD, a metal pattern which completely covers the upper surface of the through-silicon via TSV (see FIG. 1) is not formed.

Therefore, it is unlikely that shorting between wirings over the first layer wiring occurs due to a recess made in the upper surface of the first wiring layer during polishing for a large metal pattern like a pad PD. Consequently the reliability of the semiconductor device is improved.

Also, since there is no need to form a large metal pattern and a wiring is made in the first wiring layer immediately over the through-silicon via TSV, the freedom in wiring layout is higher than when a pad PD is formed, which allows miniaturization of the semiconductor device.

As mentioned so far, a major feature of the semiconductor device according to this embodiment is to form the liner insulating film covering the through-silicon via in a way to cover the semiconductor element and use it as the interlayer insulating film for the first layer wiring and form no pad to cover the upper surface of the through-silicon via. In other words, the conductor film (wiring and via) buried through the liner insulating film is directly coupled to the contact plug coupled to the semiconductor element.

Next, the method of manufacturing a semiconductor device according to this embodiment will be described referring to FIGS. 2 to 11. FIGS. 2 to 11 are sectional views illustrating the steps of manufacturing the semiconductor device according to this embodiment. Here, the via middle method is adopted in which an LSI device except wiring layers is formed over a semiconductor substrate before a through-silicon via is formed.

Figure 2:
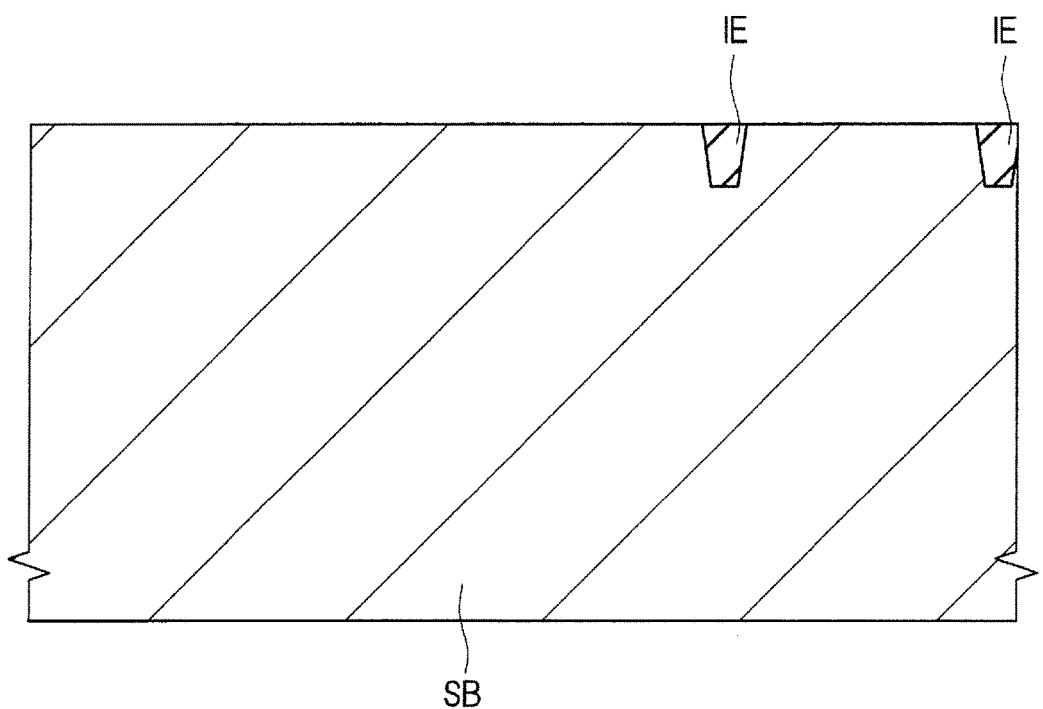
FIG. 2 is a sectional view showing a manufacturing step for the semiconductor device according to the first embodiment.

First, as shown in FIG. 2, a semiconductor substrate SB, for example, made of monocrystalline silicon is provided. Then, a ditch is made in the main surface of the semiconductor substrate SB by dry etching and an element isolation region IE with an STI structure is formed in the ditch.

Figure 3:
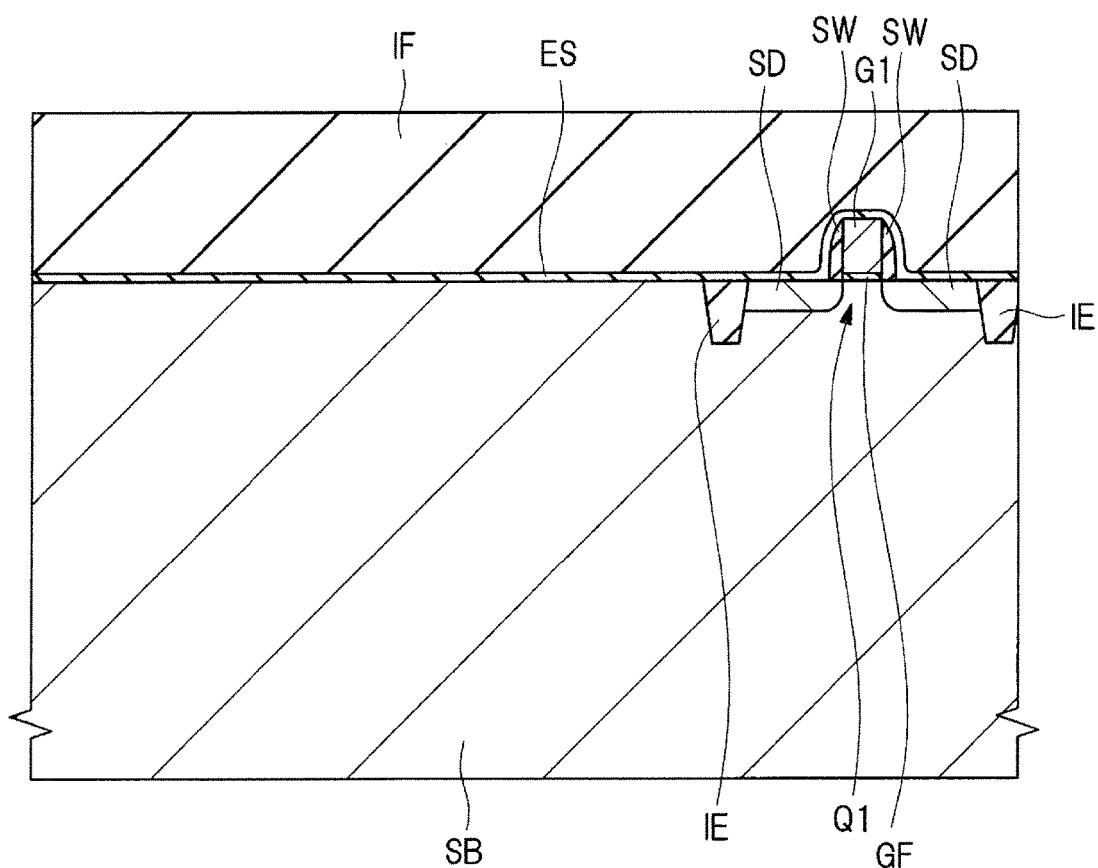
FIG. 3 is a sectional view showing a manufacturing step following the step shown in FIG. 2.

Next, as shown in FIG. 3, a MOSFET Q1 including a gate electrode G1 and source/drain regions SD is formed over the area of the main surface of the semiconductor substrate SB which is exposed from the element isolation region IE.

Since a major feature of this embodiment lies in the liner insulating film surrounding the through-silicon via, and the wiring layers, detailed explanation of the process of forming the MOSFET Q1 is omitted. Also, the semiconductor element formed over the semiconductor substrate SB is not limited to a MOSFET but it may be a bipolar transistor, diode, nonvolatile memory, capacitive element or resistive element. The height from the main surface of the semiconductor substrate SB to the upper surface of the gate electrode G1 is, for example, 0.15 μm.

Though not shown in the figure, a p-type well doped with p-type impurities (for example, B (boron)) is formed in the main surface of the semiconductor substrate SB under the gate electrode G1. The MOSFET Q1 formed here is an n-channel MOS field-effect transistor and the source/drain regions SD of the MOSFET Q1 are formed using the gate electrode G1 as a mask by implanting n-type impurity ions (for example, As (arsenic)) into the main surface of the semiconductor substrate SB.

After that, a silicide layer (not shown) is formed over the upper surfaces of the gate electrode G1 and source/drain regions SD using the known salicide technology, then a stopper insulating film ES and an interlayer insulating film IF are formed over the semiconductor substrate SB sequentially, for example, by the CVD method in a way to cover the silicide layer and the MOSFET Q1. The stopper insulating film ES is made of nitride silicon and the interlayer insulating film IF is made of silicon oxide. Then, the upper surface of the interlayer insulating film IF is flattened by the CMP method.

The stopper insulating film ES of silicon nitride has a very strong stress which causes distortion in the channel region immediately beneath the MOSFET Q1. The distortion in the channel region improves the mobility of electrons in the channel region during operation of the MOSFET Q1, thereby increasing the driving current for the MOSFET Q1.

Figure 4:
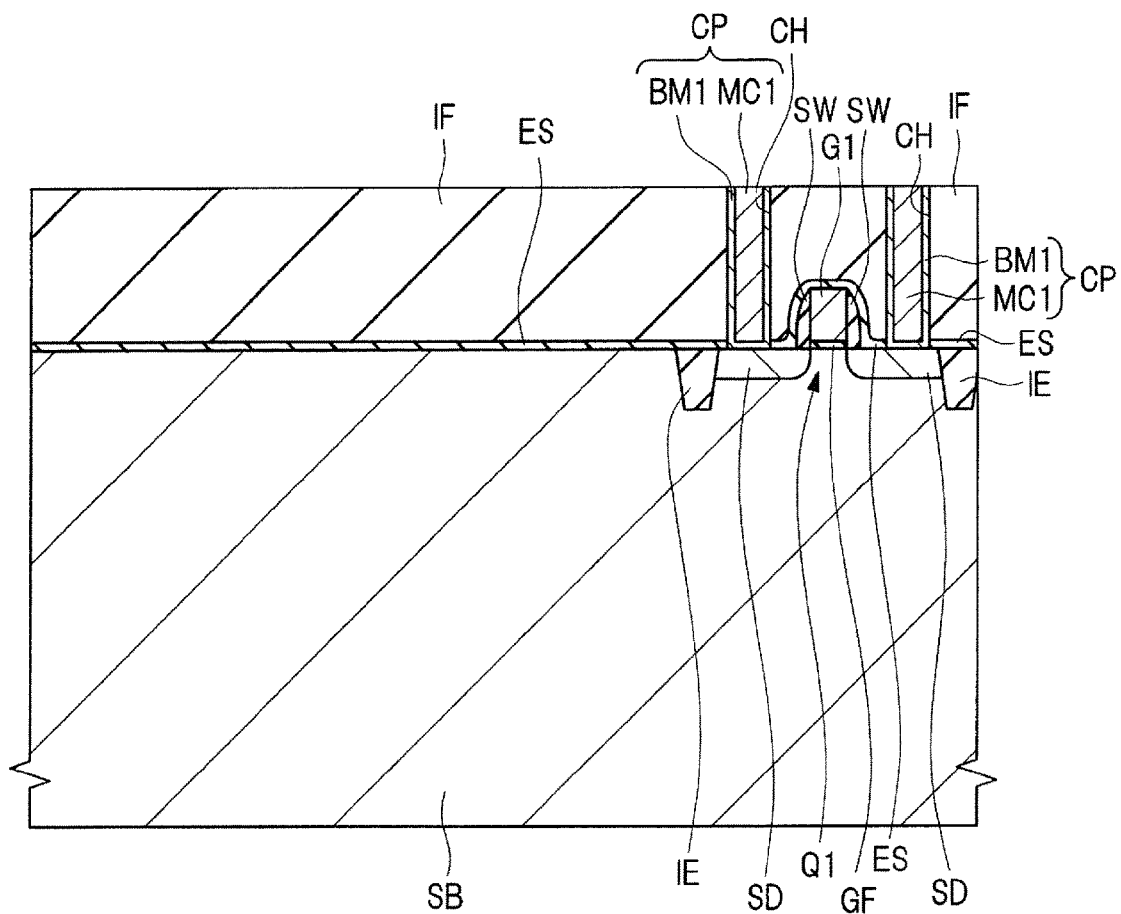
FIG. 4 is a sectional view showing a manufacturing step following the step shown in FIG. 3.

Next, as shown in FIG. 4, a plurality of contact holes CH which penetrate the laminated film included of the stopper insulating film ES and interlayer insulating film IF are made by the photolithographic technique and dry etching method so that the silicide layer (not shown) over the upper surface of each of the gate electrode G1 and source/drain regions SD is exposed. Then, a plurality of contact plugs CP to be electrically coupled to the gate electrode G1 and source/drain regions SD respectively are formed as buried in the contact holes CH. The contact plug CP coupled to the gate electrode G1 is not shown in the figure.

When forming a contact plug CP, first a barrier conductor film BM1 is formed over the entire main surface of the semiconductor substrate SB by sputtering or the like. The barrier conductor film BM1 is made of Ti (titanium) or TiN (titanium nitride). Then, a main conductor film MC1 of tungsten is formed over the entire upper surface of the semiconductor substrate SB by PVD (Physical Vapor Deposition). Then, excessive portions of the barrier conductor film BM and main conductor film MC1 over the interlayer insulating film IF are removed by etching back to expose the upper surface of the interlayer insulating film IF so that a contact plug CP included of the barrier conductor film BM and main conductor film MC1 left in the contact hole CH is formed.

Figure 5:
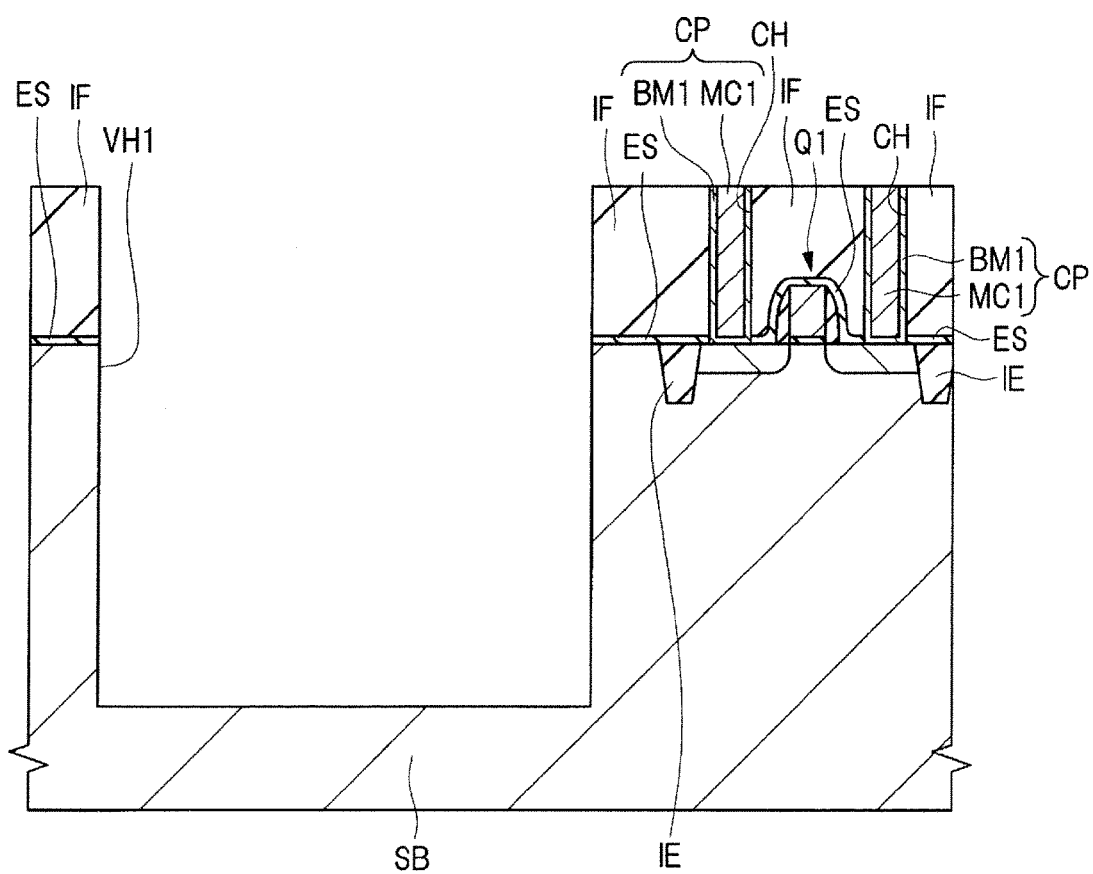
FIG. 5 is a sectional view showing a manufacturing step following the step shown in FIG. 4.

Next, as shown in FIG. 5, a via hole VH1 which penetrates the interlayer insulating film IF and stopper insulating film ES and reaches a depth in the semiconductor substrate SB is made by the photolithographic technique and dry etching method. As the dry etching method, the Bosch method in which etching and deposition are repeated alternately may be adopted. The diameter of the via hole VH1 is 3 to 10 μm and in this case it is 6 μm. The depth of the via hole VH1 from the upper surface of the interlayer insulating film IF to the bottom of the via hole VH1 is 52 μm. The final depth of the via hole VH1 will be 50 μm because the back surface of the semiconductor substrate SB is recessed later.

Figure 6:
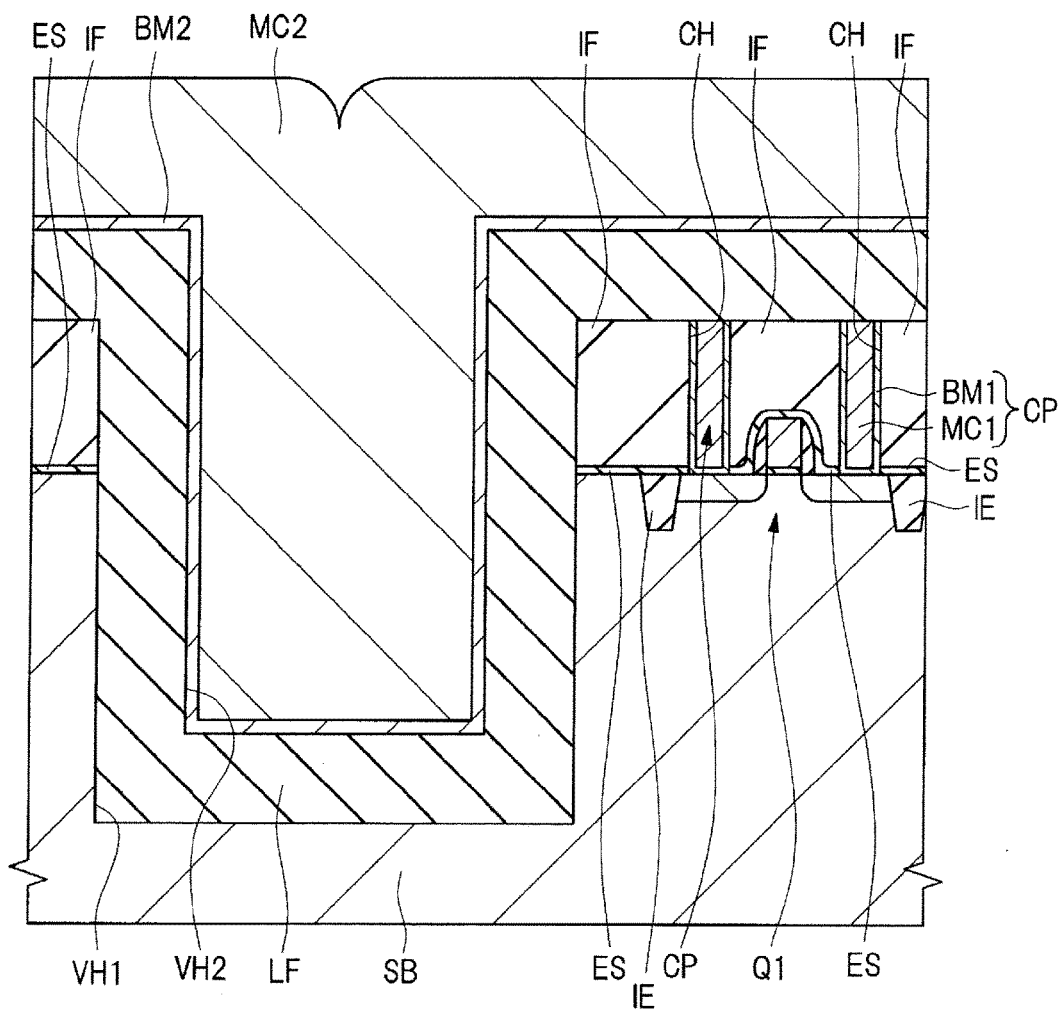
FIG. 6 is a sectional view showing a manufacturing step following the step shown in FIG. 5.

As shown in FIG. 6, a liner insulating film LF, a barrier conductor film BM2, and a main conductor film MC2 are formed over the upper surface of the semiconductor substrate SB sequentially so as to fill the inside of the via hole VH1. The liner insulating film LF is made of SiOC, for example, by the CVD method and its thickness is, for example, 1 μm. Here, the thickness of the liner insulating film LF is relatively large at about 1 μm in order to reduce capacitance between the semiconductor substrate SB and the through-silicon via to be formed later. The liner insulating film LF in the via hole VH1 has, in its inside, a via hole VH2 in which the barrier conductor film BM2 and main conductor film MC2 are buried. The barrier conductor film BM2 is a Ta (tantalum) film formed, for example, by sputtering and the main conductor film MC2 is a Cu (copper) film formed by plating.

Figure 7:
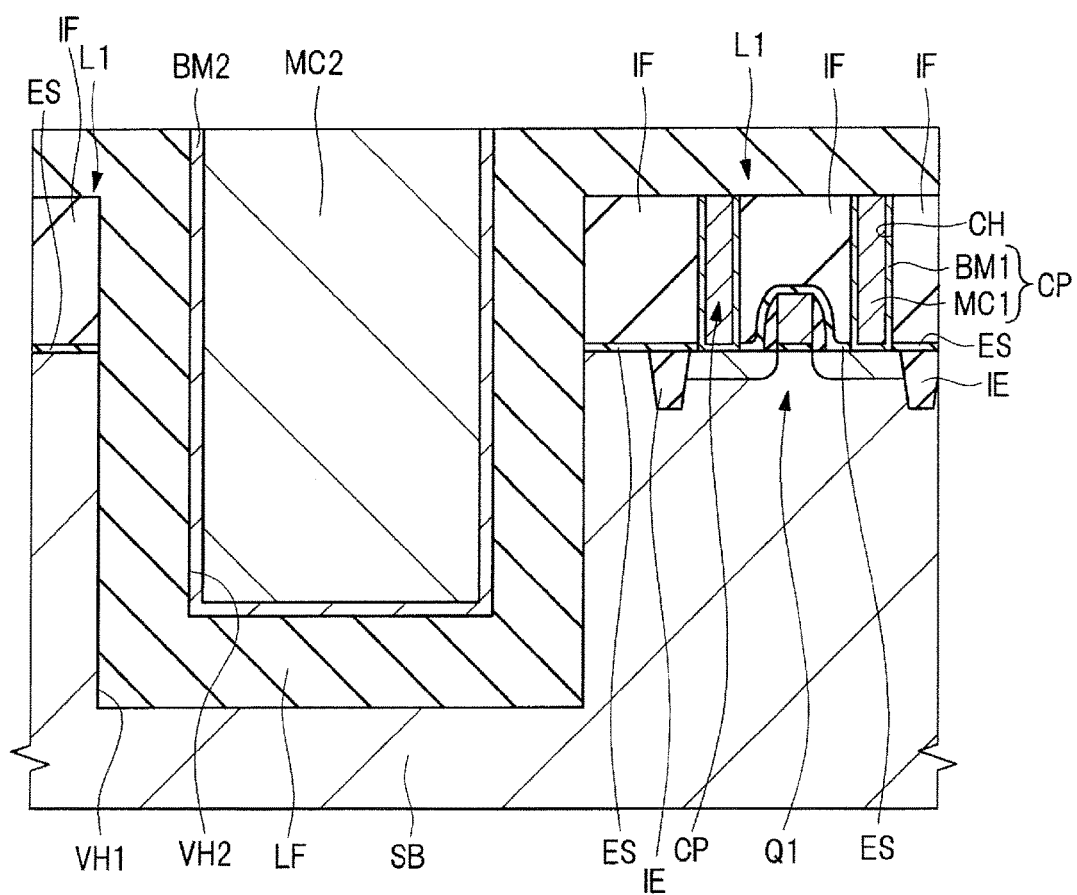
FIG. 7 is a sectional view showing a manufacturing step following the step shown in FIG. 6.

Next, as shown in FIG. 7, excessive portions of the barrier conductor film BM2 and main conductor film MC2 over the liner insulating film LF are polished by the CMP method to expose the upper surface of the liner insulating film LF immediately over the interlayer insulating film IF so that the barrier conductor film BM2 and main conductor film MC2 are left in the via hole VH1 through the liner insulating film LF. The plug included of the barrier conductor film BM2 and main conductor film MC2 has a width of 3 to 10 μm and for example, it is 6 μm.

In the above polishing step, the upper surface of the liner insulating film LF is polished by the CMP method until the desired thickness of the liner insulating film LF is obtained. The thickness of the liner insulating film LF polished by the CMP method is, for example, 0.3 μm. In this case the thickness of the liner insulating film LF is adjusted by the CMP method but dry etching may be additionally performed to adjust the thickness. When dry etching is adopted, immediately after the formation of the liner insulating film LF and before the formation of the barrier conductor film BM2, anisotropic dry etching is performed on the liner insulating film LF until the desired thickness of the liner insulating film LF is obtained. Since anisotropic etching proceeds only vertically to the main surface of the semiconductor substrate SB, the liner insulating film LF formed on the sidewall of the via hole VH1 is not etched.

The liner insulating film LF formed over the interlayer insulating film IF, which includes the first wiring layer, is used as an interlayer insulating film L1 which a first layer wiring (to be formed later) is buried. In other words, in this embodiment, since the liner insulating film LF is used as the interlayer insulating film L1 which includes the first wiring layer, the step of newly forming (depositing) an insulating film for use as an interlayer insulating film for the first wiring layer is not needed.

Figure 8:
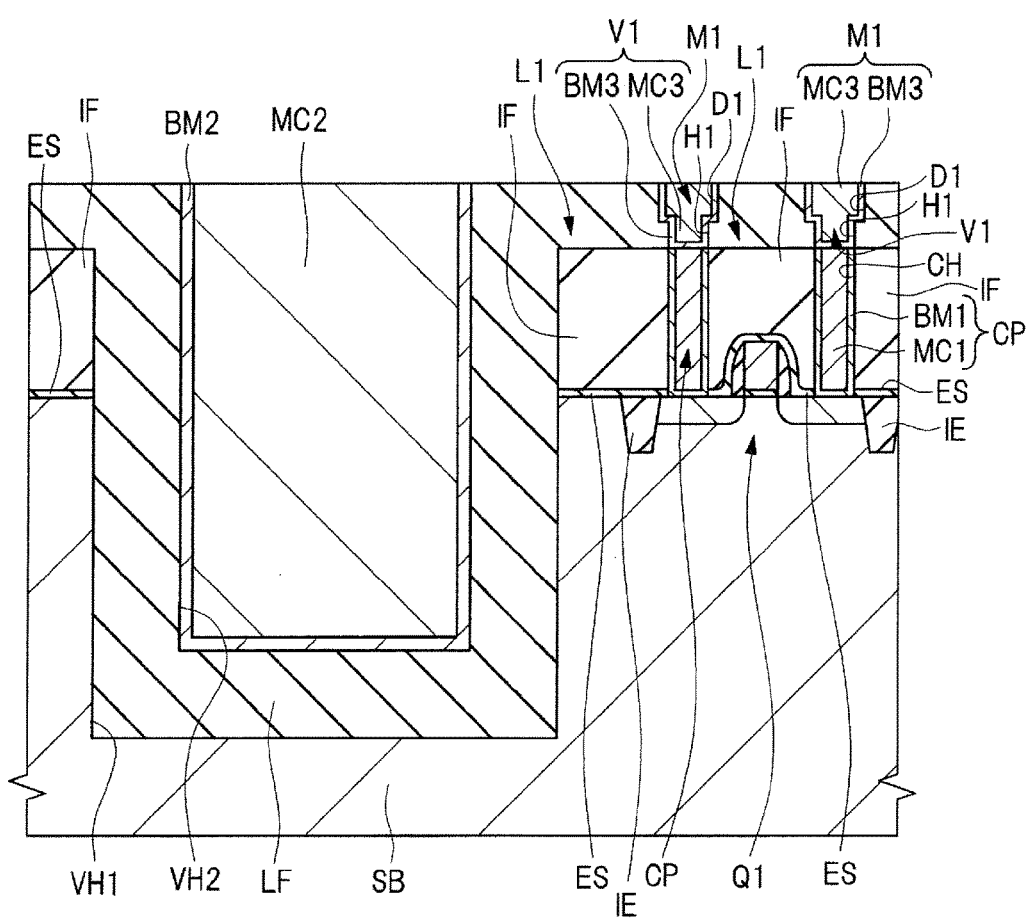
FIG. 8 is a sectional view showing a manufacturing step following the step shown in FIG. 7.

Next, a first wiring layer is formed as shown in FIG. 8. While in the step shown in FIG. 19 in the comparative example an insulating film which includes the first wiring layer is newly deposited by the CVD method, in this embodiment it is unnecessary to forma new insulating film because the liner insulating film LF is used as the interlayer insulating film L1 for the first wiring layer as mentioned above. The interlayer insulating film L1, integrated with the liner insulating film LF, is a low-k SiOC film, so electrolysis in the first wiring layer over the liner insulating film LF is reduced and parasitic capacitance is decreased.

Here, wirings in the first wiring layer are formed by the dual damascene method. Specifically, first a plurality of via holes H1 which extend from the upper surface of the interlayer insulating film L1 to its lower surface and expose the upper surfaces of the contact plugs and main conductor films MC1 respectively are formed by the photolithographic technique and dry etching method. Then, a plurality of wiring ditches D1 are made in the upper surface of the interlayer insulating film L1 by the photolithographic technique and dry etching method. Each wiring ditch D1 reaches a depth in the thickness of the interlayer insulating film L1.

Some part of a wiring ditch D1 overlaps a via hole H1 in a plan view. In other words, a via hole H1 makes an opening in part of the bottom of a wiring ditch D1 extending along the upper surface of the interlayer insulating film L1. In this case, via holes H1 in the first wiring layer are formed before the formation of wiring ditches D1 but they may be formed after the formation of wiring ditches D1.

Next, a barrier conductor film BM3 is formed over the entire upper surface of the semiconductor substrate SB by sputtering or the like in a way to cover the inner surfaces of the wiring ditches and via holes H1. Then, a Cu (copper) seed film (not shown) is formed over the surface of the barrier conductor film BM3 by sputtering, then a main conductor film MC3 is formed by plating or the like. Thus, each wiring ditch D1 and via hole H1 are completely filled by the barrier conductor film BM3, seed film and main conductor film MC3. The main conductor film MC3 is made of Cu (copper) and the barrier conductor film BM3 is made of Ta (tantalum), TaN (tantalum nitride) or TiN (titanium nitride) or a laminated film of these materials.

After that, excessive portions of the barrier conductor film BM3 and main conductor film MC3 over the interlayer insulating film L1 are removed by the CMP method to expose the upper surface of the interlayer insulating film L1 so that the barrier conductor film BM3 and main conductor film MC3 are left in the wiring ditch D1 and via hole H1. This completes the process of forming a first layer wiring D1 included of the barrier conductor film BM3, seed film, and main conductor film MC3 which are formed in the wiring ditch D1, and a via V1 included of the barrier conductor film BM3, seed film, and main conductor film MC3 which are formed in the via hole H1. Thus, in this embodiment, the wiring and via in the first wiring layer are integrally formed from the same conductor film.

Figure 9:
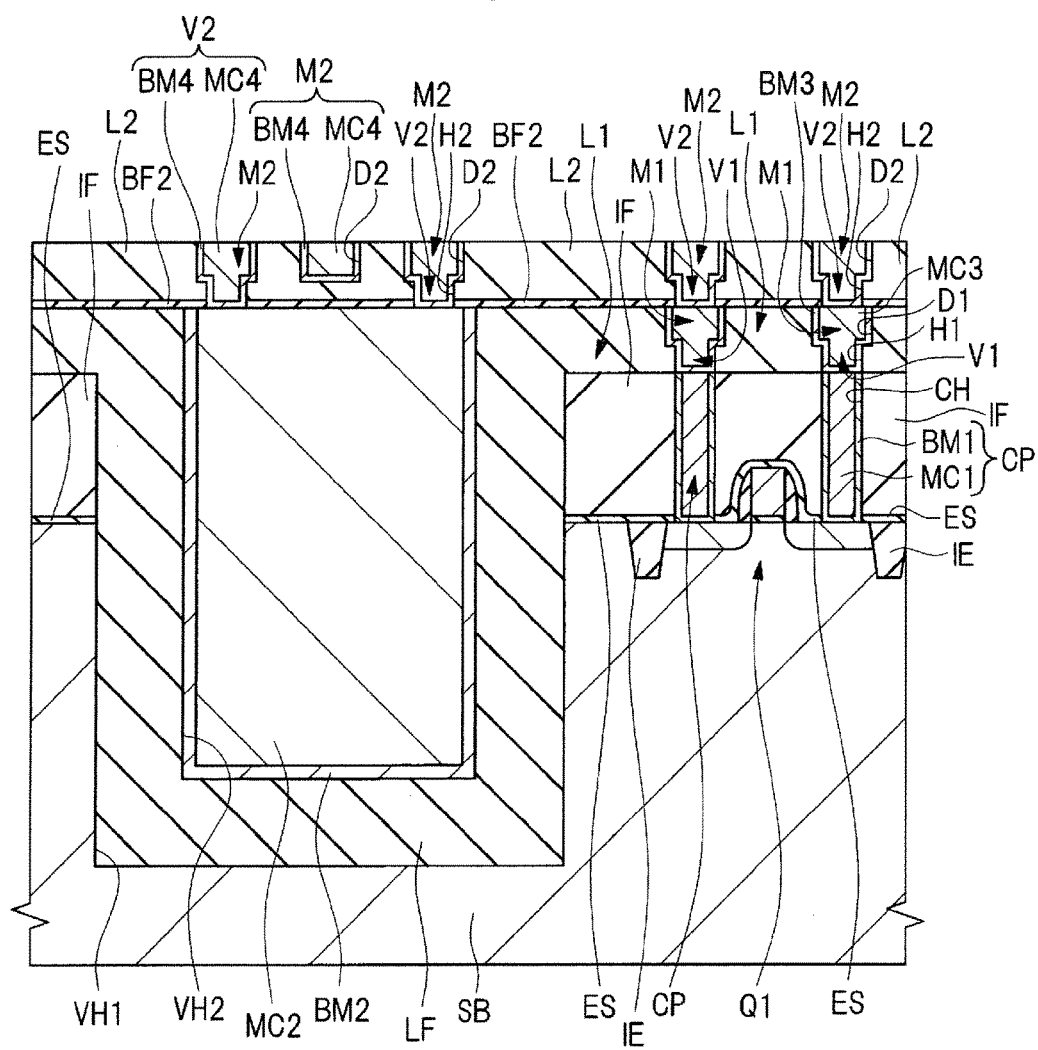
FIG. 9 is a sectional view showing a manufacturing step following the step shown in FIG. 8.

Next, as shown in FIG. 9, a second wiring layer is formed over the first wiring layer. First, a barrier conductor film BF2 and an interlayer insulating film L2 are stacked sequentially over the interlayer insulating film L1, first layer wirings M1, barrier conductor film BM2, and main conductor film MC2 respectively, for example, by the CVD method. Here, a large pad PD like the one in the comparative example as illustrated in FIG. 19 is not formed under the barrier insulating film BF2 and interlayer insulating film L2. In other words, since no conductor pattern with a recess in its upper surface is formed in the upper surface of the first wiring layer, the upper surface of the interlayer insulating film L2 formed (deposited) over the first wiring layer can be flattened.

After that, via holes H2 and wiring ditches D2 which penetrate the laminated film included of the barrier insulating film BF2 and interlayer insulating film L2 are formed in the same way as in the step illustrated in FIG. 8, and then second layer wirings M2 and vias V2 are formed by the dual damascene method. Specifically, wiring ditches D2 and via holes H2 which expose the upper surfaces of the first layer wirings M1 are formed by the photolithographic technique and etching method. Each via hole H2 is formed in a way to penetrate the interlayer insulating film L2 and the barrier insulating film BF2. Each wiring ditch D2 reaches a depth in the interlayer insulating film L2 but does not reach the barrier insulating film BF2.

After that, a barrier conductor film BM4, seed film (not shown) and main conductor film MC4 are formed sequentially by sputtering and plating to fill the insides of the wiring ditches D2 and via holes H2. Then, excessive portions of the barrier conductor film BM4, seed film, and main conductor film MC4 over the interlayer insulating film L2 are removed by the CMP method to expose the upper surface of the interlayer insulating film L2 so that a second layer wiring M2 included of the barrier conductor film BM4 and main conductor film MC4 and a via V2 are formed in a wiring ditch D2 and via hole H2 respectively. The main conductor film MC4 is made of Cu (copper) and the barrier conductor film BM4 is made of Ta (tantalum), TaN (tantalum nitride) or TiN (titanium nitride) or a laminated film of these materials.

In the second wiring layer, a plurality of second layer wirings M2 and a plurality of vias V2 are formed by the dual damascene method. Some vias V2 are coupled to the upper surface of a first layer wiring M1 and other vias V2 are coupled to the upper surface of the main conductor film MC2. A plurality of second layer wirings M2 each having a wiring width of, for example, 50 nm are arranged in line at intervals of 0.1 μm immediately over the main conductor film MC2 with a diameter of about 6 μm. Some of the second layer wirings M2 are electrically coupled to the main conductor film MC2 and others are insulated from the main conductor film MC2.

Due to the absence of a recess in the upper surface of the interlayer insulating film L2 as shown in FIG. 20, in the step of polishing by the CMP method to form the second layer wirings M2, no excessive main conductor film MC4 is left over the interlayer insulating film L2 and the second layer wirings M2 are formed in the respective wiring ditches D2 separately. Therefore, it is unlikely that shorting occurs between second layer wirings M2 immediately over the main conductor film MC2 through the main conductor film MC4 left over the interlayer insulating film L2.

Next, though not shown in the figure, a plurality of wiring layers are formed over the second wiring layer and bump electrodes are formed in the uppermost layer for coupling to a redistribution wiring layer or printed circuit board. This concludes the wafer front-end process. For example, six wiring layers, including the first wiring layer and second wiring layer as shown in FIG. 9, are formed.

Figure 10:
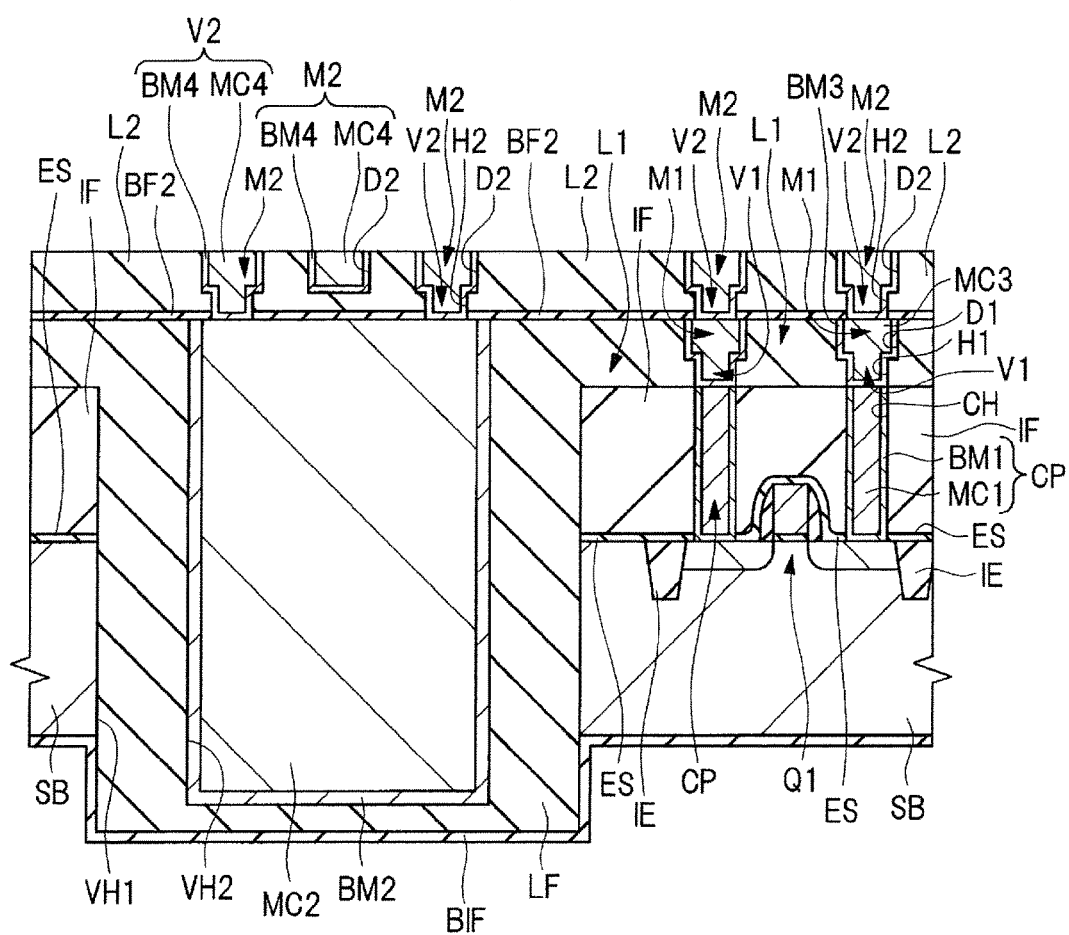
FIG. 10 is a sectional view showing a manufacturing step following the step shown in FIG. 9.

Next, as shown in FIG. 10, the manufacturing sequence proceeds to the back-end process including the step of exposing the bottom of the through-silicon via. In the via middle method, since the bottom of the plug, included of the main conductor film MC2 and barrier conductor film BM2 to include a through-silicon via, is at a depth in the semiconductor substrate SB, the semiconductor substrate SB must be polished to expose the bottom of the plug. Here, the back surface of the semiconductor substrate SB, for example, with a thickness of 750 µm is ground by a wafer grinding apparatus to decrease the thickness of the semiconductor substrate SB. At this time, the bottom of the liner insulating film LF is not exposed from the bottom of the semiconductor substrate SB.

After that, the semiconductor substrate SB is etched by the dry etching method so that the bottoms of the plug and liner insulating film LF protrude from the bottom of the semiconductor substrate SB. Consequently the thickness of the semiconductor substrate SB becomes about 50 µm. In this etching step, etching selectivity is adjusted so that the liner insulating film LF is left, and Si (silicon) is selectively etched. Therefore, after the back surface of the semiconductor substrate SB has been ground and etched as mentioned above, the bottom of the plug is still covered by the liner insulating film LF or not exposed. In other words, the bottom of the liner insulating film LF and part of the sidewall are exposed from the back surface of the semiconductor substrate SB.

After that, an insulating film BIF is formed, for example, by the CVD method in a way to cover the back surface of the semiconductor substrate SB and the bottom of the liner insulating film LF. The insulating film BIF, for example, made of silicon nitride, has a function to prevent the semiconductor substrate SB from being contaminated with impurities through the back surface of the semiconductor substrate SB.

Figure 11:
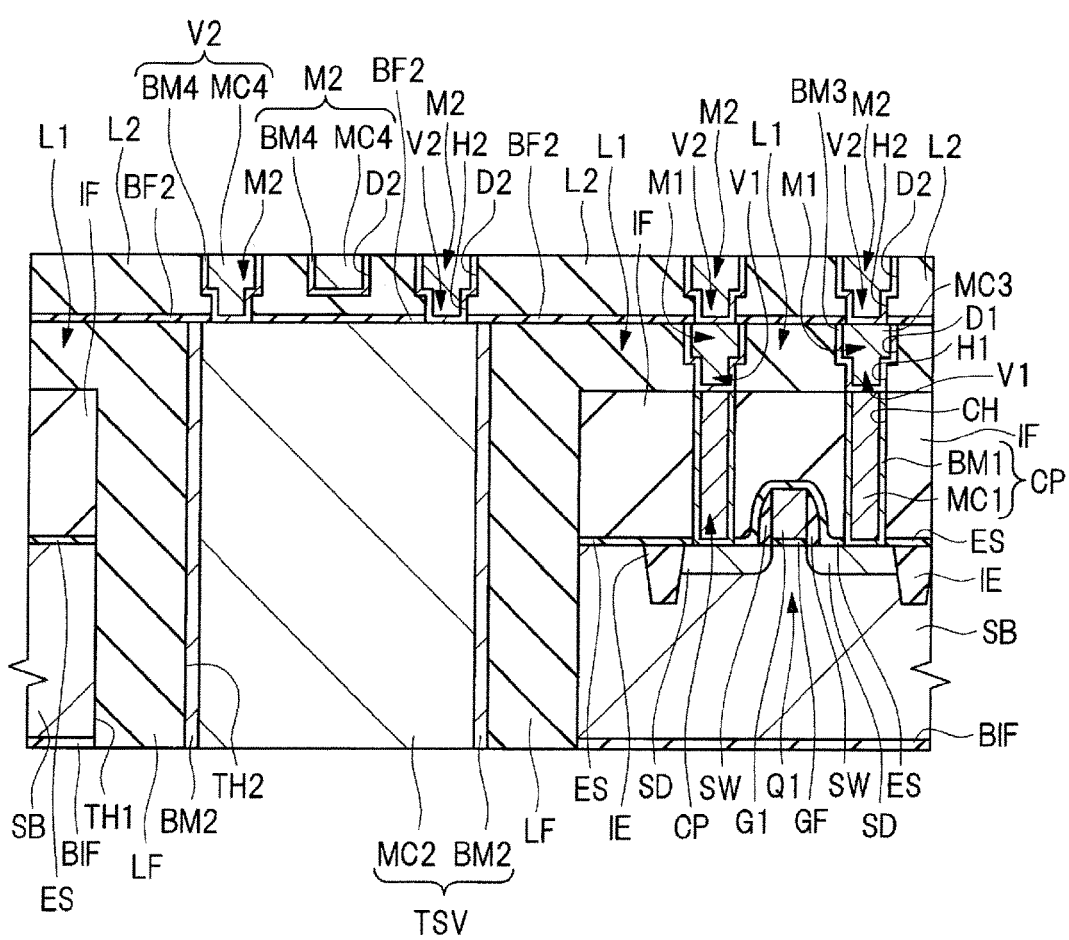
FIG. 11 is a sectional view showing a manufacturing step following the step shown in FIG. 10.

Next, as shown in FIG. 11, the liner insulating film LF protruding from the back surface of the semiconductor substrate SB and the plug included of the main conductor film MC2 and barrier conductor film BM2 are polished by the CMP method or the like. In this polishing step, a through hole TH1 which penetrates the interlayer insulating film IF, stopper insulating film ES, and semiconductor substrate SB is made and a through-silicon via TSV included of the main conductor film MC2 and barrier conductor film BM2 is formed inside the through hole TH1. Consequently the semiconductor chip, including the through-silicon via TSV, which includes the semiconductor device according to this embodiment, is completed. The through-silicon via TSV is formed as buried in a through hole TH2 which penetrates the liner insulating film LF from its top to bottom. The bottom of the through-silicon via TSV is flattened so that it is flush with the bottom of the semiconductor substrate SB.

Next the advantageous effects of this embodiment will be described.

The semiconductor device manufacturing process according to this embodiment is different from that in the comparative example described above referring to FIGS. 14 to 21 in that the liner insulating film LF over the interlayer insulating film IF is not removed but it is used as the interlayer insulating film L1 for the first wiring layer. Consequently, since it is unnecessary to newly form a low-k film for the formation of the interlayer insulating film L1, the amount of grinding in the polishing step is decreased and the time required for polishing is shortened, thereby simplifying the semiconductor device manufacturing process. A decrease in the amount of grinding in the polishing step prevents unevenness in the amount of polishing, so the upper surface of the film to be polished can be polished more evenly.

In addition, since it is unlikely that the polishing step to remove the liner insulating film LF over the interlayer insulating film IF causes a decrease in the thickness of the interlayer insulating film IF as seen in the comparative example, shorting does not occur between a semiconductor element such as the MOSFET Q1 and a first layer wiring M1 in the first wiring layer. Consequently the reliability of the semiconductor device is improved.

Furthermore, since the liner insulating film LF, a low-k film, is used as the interlayer insulating film L1 for the first wiring layer, wiring parasitic capacitance is reduced. Also since the etching selectivity between the interlayer insulating film L1 and interlayer insulating film IF is high, it is unnecessary to provide an etching stopper film which may increase capacitance between the wiring and element, between the interlayer insulating film L1 and interlayer insulating film IF. Therefore, the performance of the semiconductor device is improved.

In the semiconductor device manufacturing process according to this embodiment, a pad PD (see FIG. 21) which covers the upper surface of the through-silicon via TSV is not formed but the via V2 of a second layer wiring is directly coupled to the upper surface of the through-silicon via TSV. Since the area of the upper surface of the through-silicon via TSV which is exposed from the via V2 is covered by the barrier insulating film BF2, diffusion of Cu (copper) from the through-silicon via TV into the interlayer insulating film does not occur even without a pad PD. Therefore, in this embodiment, since it is unnecessary to form a large pad PD, a metal pattern which completely covers the upper surface of the through-silicon via TSV is not formed.

Therefore it is unlikely that shorting occurs between wirings over the first layer wiring because of a recess in the upper surface of the first wiring layer which may be made during the formation of a large metal pattern for a pad PD. Consequently the reliability of the semiconductor device is improved.

Also, since it is unnecessary to form a large metal pattern and a wiring can be located in the first wiring layer immediately over the through-silicon via TSV, the freedom in wiring layout is higher than when a pad PD is formed and the semiconductor device can be miniaturized.

As mentioned above, in this embodiment, the thickness of the interlayer insulating film L1 is 0.3 µm and a wiring buried in the first wiring layer is formed by the dual damascene method. The wiring buried in the first wiring layer can be formed by the single damascene method as in the comparative example explained above. When the single damascene method is adopted, a via is not made between the wiring and the underlying contact plug. When the wiring in the first wiring layer is formed by the single damascene method, the manufacturing cost is lower than when the dual damascene method is employed, because etching and photolithographic steps can be omitted.

However, if the thickness of the liner insulating film LF formed over the interlayer insulating film IF in the contact layer is uneven and if the thickness of the interlayer insulating film L1 is still uneven even after the step of polishing by the CMP method as illustrated in FIG. 7, there would also be thickness unevenness in the first layer wiring formed by the single damascene method in which conductor film is buried in a ditch penetrating the interlayer insulating film L1. In wiring, film thickness unevenness leads to resistance unevenness. Therefore, if the wiring formed by the single damascene method has thickness unevenness, wiring resistance unevenness would result and the reliability of the semiconductor device might decline.

On the other hand, in this embodiment, first layer wirings Ni in the first wiring layer are formed by the dual damascene method, so even if the interlayer insulating film L1 has thickness unevenness, the thickness of the first layer wirings M1 can be made constant in all regions by changing the height of the via V1 according to the unevenness. Consequently the resistance unevenness of the wirings in the first wiring layer is minimized and the reliability of the semiconductor device is improved. In this embodiment, the thickness of the interlayer insulating film L1 is relatively large at 0.3 μm, so the first layer wirings M1 and via V1 can be formed by the dual damascene method.

Second Embodiment

Figure 12:
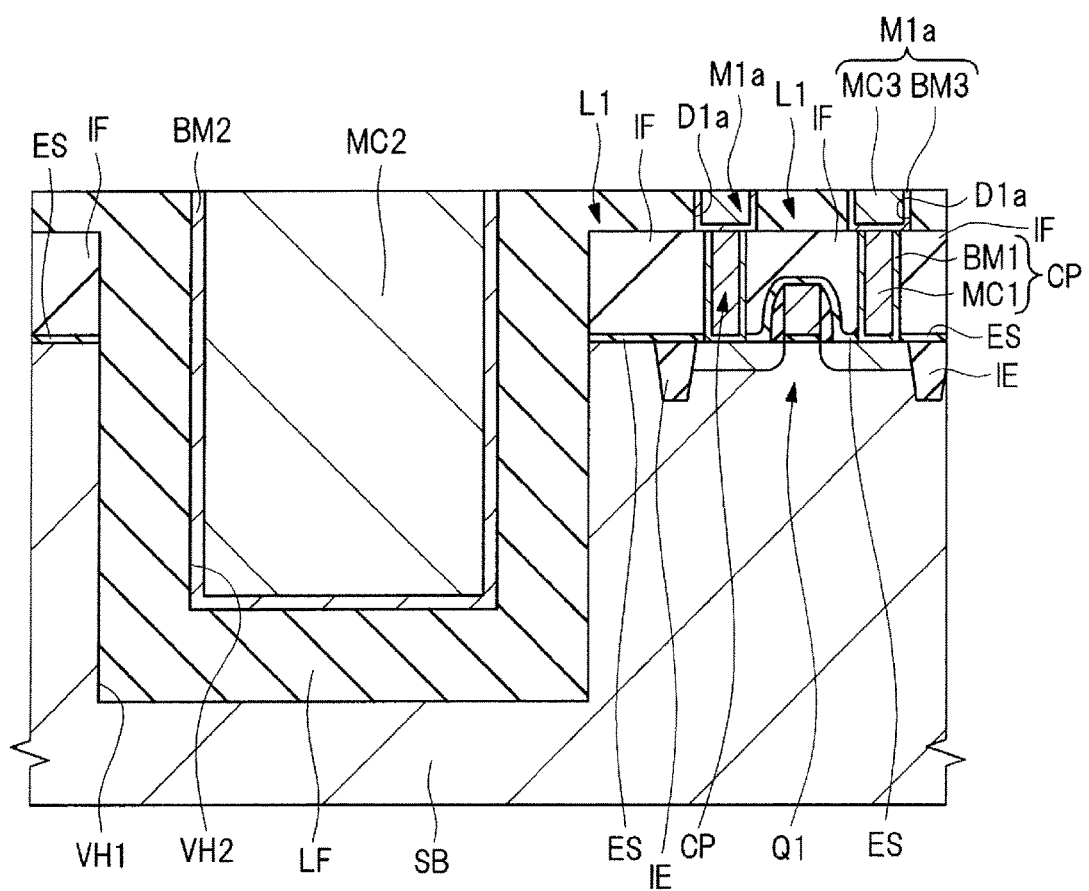
FIG. 12 is a sectional view showing a manufacturing step for a semiconductor device according to a second embodiment of the present invention.
Figure 13:
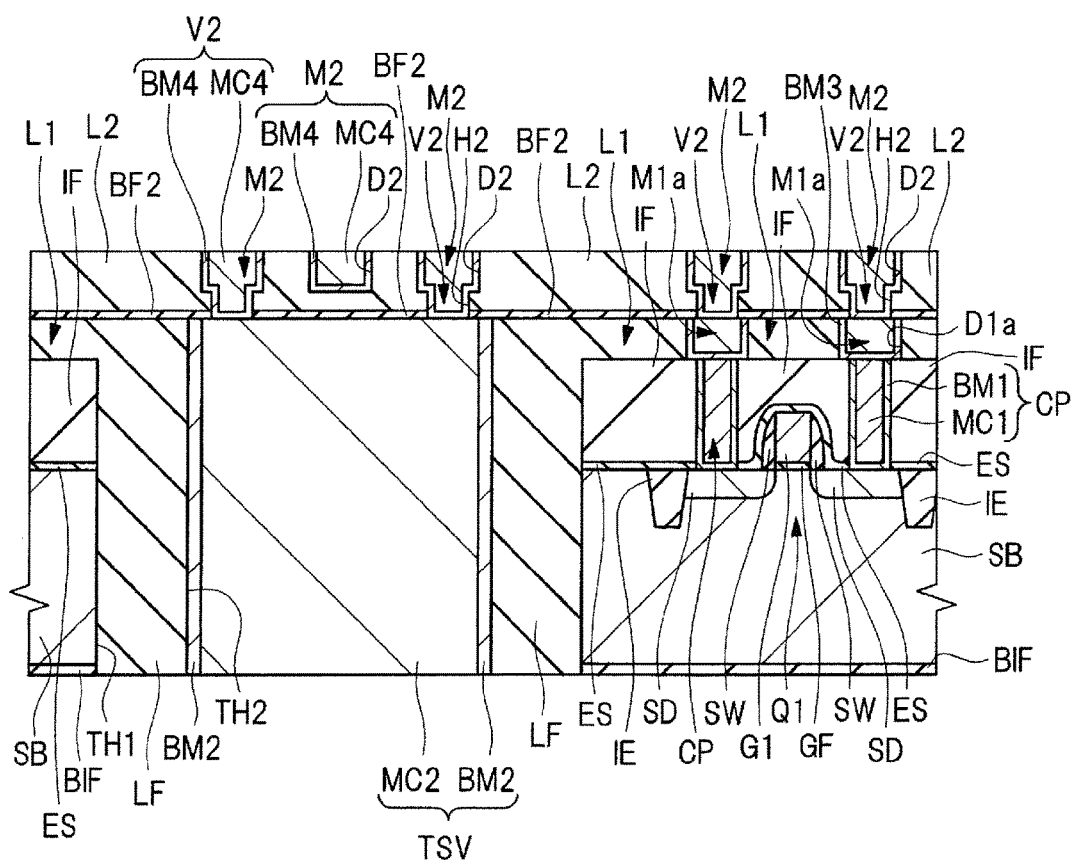
FIG. 13 is a sectional view showing a manufacturing step following the step shown in FIG. 12.

In the above embodiment, the first layer wirings in the first wiring layer are formed by the dual damascene method. In the second embodiment, the first layer wirings are formed by the single damascene method, which will be described below referring to FIGS. 12 and 13. FIGS. 12 and 13 are sectional views illustrating the process of manufacturing a semiconductor device according to the second embodiment. Here, as in the first embodiment, the via middle method is adopted in which an LSI device except wiring layers is formed over a semiconductor substrate before the formation of a through-silicon via.

First, the steps shown in FIGS. 2 to 7 are carried out as in the first embodiment. Here, the liner insulating film LF in the region surrounding the main conductor film MC2 has a thickness of 1 μm and the interlayer insulating film L1 as part of the liner insulating film LF over the interlayer insulating film IF has a thickness of 0.2 μm. The thickness of this interlayer insulating film L1 is smaller than the thickness of the interlayer insulating film L1 in the first embodiment.

Next, as shown in FIG. 12, a ditch D1a as an opening in the interlayer insulating film L1 is made by the known single damascene method and conductor film is buried in the ditch D1a to form a first layer wiring M1a. Specifically, after the step illustrated in FIG. 7, a plurality of ditches D1a as openings in the interlayer insulating film L1 are made by the photolithographic technique and dry etching method to expose the upper surfaces of the contact plugs CP. Then, a barrier conductor film BM3 is formed over the semiconductor substrate SB by sputtering or the like in a way to cover the inner sidewall and bottom of the ditch D1a, then a seed film (not shown) is formed by sputtering in a way to cover the surface of the barrier conductor film BM3. For example, the barrier conductor film BM3 is made of Ta (tantalum), TaN (tantalum nitride) or TiN (titanium nitride) or a laminated film of these materials.

Next, a main conductor film MC3 of Cu (copper) is formed over the seed film by plating, then excessive portions of the barrier conductor film BM3, seed film, and main conductor film MC3 over the interlayer insulating film L1 are removed by the CMP method or the like. Thus, a first layer wiring M1a, included of the barrier conductor film BM3, seed film, and main conductor film MC3 which are buried in the wiring ditch D1a, is completed.

After that, the same steps as illustrated in FIGS. 9 to 11 are carried out to complete the semiconductor device according to the second embodiment as shown in FIG. 13.

In this embodiment, since the first layer wirings M1a in the first wiring layer are formed by the single damascene method, as mentioned above the manufacturing cost is lower than when the dual damascene method is adopted to form the first layer wirings, because etching and photolithographic steps can be omitted.

The invention made by the present inventors has been so far explained concretely in reference to the preferred embodiments thereof. However, the invention is not limited thereto and it is obvious that these details may be modified in various ways without departing from the spirit and scope thereof.

What is claimed is:

1. A method of manufacturing a semiconductor device comprising the steps of:
    (a1) providing a semiconductor substrate;
    (b1) forming a semiconductor element over the semiconductor substrate;
    (c1) forming a first interlayer insulating film which covers the semiconductor element;
    (d1) forming a contact plug which penetrates the first interlayer insulating film and is coupled to the semiconductor element;
    (e1) after the step (d1) above, making a via hole which penetrates the first interlayer insulating film and reaches a depth in the semiconductor substrate;
    (f1) forming a first insulating film which covers an inside surface of the via hole and is directly on an upper surface of the first interlayer insulating film;
    (g1) burying a first conductor film in the via hole through the first insulating film;
    (h1) polishing the first conductor film to expose the upper surface of the first insulating film such that a thickness of the first insulating film in the via hole in the direction perpendicular to the inside surface of the via hole is about 1 μm, and a thickness of the first insulating film over the first interlayer insulating film is about 0.3 μm, the first insulating film having a lower relative permittivity than a silicon oxide film;
    (i1) after the step (h1) above, forming a first ditch in the upper surface of the first insulating film and forming a first wiring coupled to the contact plug in the first ditch, and
    (j1) recessing a back surface of the semiconductor substrate and exposing a bottom of the first conductor film to form a through electrode included of the first conductor film.

2. The method of manufacturing a semiconductor device according to claim 1, further comprising the steps of:
    (i2) after the step (i1), forming a second insulating film and a second interlayer insulating film over the first insulating film sequentially to cover an upper surface of the first conductor film; and
    (i3) making a plurality of second ditches in an upper surface of the second interlayer insulating film and forming, in the second ditches, a plurality of second wirings coupled to the first wirings and the through electrodes respectively,
    wherein an upper surface of the through electrode is in contact with the second insulating film.

3. The method of manufacturing a semiconductor device according to claim 1,
    wherein in the step (i1), a via which penetrates the first insulating film and includes a conductor film constituting the first wiring is formed, and
    wherein the first wiring is electrically coupled to the contact plug through the via.

4. The method of manufacturing a semiconductor device according to claim 1,
    wherein in the step (i1), the first wiring is formed in direct contact with the contact plug.

5. The method of manufacturing a semiconductor device according to claim 1,
    wherein the first insulating film contains SiOC.

* * * * *